United States Patent
Ito et al.

(10) Patent No.: US 7,519,337 B2
(45) Date of Patent: Apr. 14, 2009

(54) TRANSMITTER AND MOBILE COMMUNICATION TERMINAL USING THE SAME

(75) Inventors: Masahiro Ito, Kokubunji (JP); Taizo Yamawaki, Tokyo (JP); Yoshiaki Harasawa, Maebashi (JP)

(73) Assignee: Renesas Technology Corp., Tokyo (JP)

( * ) Notice: Subject to any disclaimer, the term of this patent is extended or adjusted under 35 U.S.C. 154(b) by 452 days.

(21) Appl. No.: 11/304,914

(22) Filed: Dec. 16, 2005

(65) Prior Publication Data

US 2006/0135093 A1 Jun. 22, 2006

(30) Foreign Application Priority Data

Dec. 21, 2004 (JP) ............................. 2004-368962
Sep. 2, 2005 (JP) ............................. 2005-254344

(51) Int. Cl.
*H01Q 11/12* (2006.01)
(52) U.S. Cl. ..................... 455/127.3; 455/126; 455/102; 455/108; 330/129; 330/136; 330/254; 330/278; 330/285
(58) Field of Classification Search ...... 455/126–127.5, 455/232.1, 102, 108, 110–113; 330/254, 330/278, 279, 285, 296, 129, 136
See application file for complete search history.

(56) References Cited

U.S. PATENT DOCUMENTS

| 4,788,509 | A * | 11/1988 | Bahl et al. ...................... 330/54 |
| 5,311,143 | A * | 5/1994 | Soliday ........................ 330/127 |
| 6,178,313 | B1 * | 1/2001 | Mages et al. ............. 455/127.2 |
| 6,417,729 | B1 * | 7/2002 | Lemay et al. ................ 330/129 |
| 6,427,067 | B1 * | 7/2002 | Arentz ..................... 455/232.1 |
| 7,034,617 | B2 * | 4/2006 | Takahashi et al. ........... 330/279 |
| 2002/0127990 | A1 * | 9/2002 | Bollenbeck .................. 455/293 |
| 2003/0016082 | A1 * | 1/2003 | Matsunaga et al. .......... 330/133 |
| 2003/0141932 | A1 * | 7/2003 | Toyota et al. ................ 330/285 |
| 2003/0224740 | A1 * | 12/2003 | Takano et al. ............... 455/102 |
| 2003/0224743 | A1 * | 12/2003 | Okada et al. ............. 455/127.2 |
| 2004/0198257 | A1 * | 10/2004 | Takano et al. ............... 455/108 |
| 2005/0064828 | A1 * | 3/2005 | Kurakami et al. ......... 455/115.1 |
| 2005/0070233 | A1 | 3/2005 | Sowlati ...................... 455/126 |

FOREIGN PATENT DOCUMENTS

JP 2004-007443 1/2004

* cited by examiner

*Primary Examiner*—Edward Urban
*Assistant Examiner*—Junpeng Chen
(74) *Attorney, Agent, or Firm*—Miles & Stockbridge P.C.

(57) ABSTRACT

A transmitter employing variable gain amplifiers and operating with both constant and nonconstant envelope modulation systems is contrived to suppress variation in the transmitting power when constant envelope modulation is performed. The transmitter comprises a PM loop, an AM loop, and a variable gain amplifier which is shared by the PM loop and the AM loop and combines phase information that the PM loop outputs and envelope information that the AM loop outputs by gain control. The variable gain amplifier comprises a variable gain amplifier body having a supply voltage terminal and a bias current detection terminal for extracting a bias current corresponding to a gain, wherein the gain changes with a change in the potential of the supply voltage terminal, and a bias control block connected to the supply voltage terminal and the bias current detection terminal. Thereby, a bias control loop is formed to control the bias current so that the gain in the case of constant envelope modulation becomes a predetermined value.

23 Claims, 14 Drawing Sheets

| SWON | BETWEEN SWIN AND SWOUT |
|---|---|
| POWER SUPPLY | SHORT CIRCUIT |
| GND | OPEN |

| SWON | BETWEEN SWIN1 AND SWOUT | BETWEEN SWIN2 AND SWOUT |
|---|---|---|
| POWER SUPPLY | SHORT CIRCUIT | OPEN |
| GND | OPEN | SHORT CIRCUIT |

US 7,519,337 B2

TRANSMITTER AND MOBILE COMMUNICATION TERMINAL USING THE SAME

CLAIM OF PRIORITY

The present patent application claims priority from Japanese application JP 2004-368962 filed on Dec. 21, 2004, the content of which is JP 2005-254344 filed on Sep. 2, 2005, the content of which is hereby incorporated by reference into this application.

FIELD OF THE INVENTION

The present invention relates to a transmitter for use in a mobile communication terminal and, in particular, to a dual-mode compatible transmitter that operates with both constant and nonconstant envelope modulation systems.

BACKGROUND OF THE INVENTION

An example of a prior-art transmitter of a dual-mode terminal is configured, including a phase control loop which feeds back and controls the phase of an output signal from a voltage-controlled oscillator and an amplitude control loop which feeds back and controls the gain of a power amplifier which amplifies the above output signal (e.g., see patent document 1: Japanese Patent Laid-open No. 2004-7443).

SUMMARY OF THE INVENTION

In late years, there has been an explosive increase in the number of subscribers of mobile communication, mainly voice services, typified by cellular mobile phones. An example of such a communication system is a Global System for Mobile Communications (GSM) which has been developed mainly in Europe. Meanwhile, lately, there has been an increasing need for high-speed data communication in addition to voice services. In the GSM, the conventional system using a Gaussian Minimum Shift Keying (GMSK) modulation which is a constant envelope modulation is planned to change to an Enhanced Data for Global Evolution (EDGE) system using 8 Phase Shift Keying (8PSK) which is a multi-level, nonconstant envelope modulation. A mobile terminal which will operate with this EDGE system (nonconstant envelope 8PSK modulation) is required to be compatible with the conventional GSM system (constant envelope GMSK modulation). It is therefore essential to be a GSM/EGDE compatible dual mode terminal for future mobile communication.

An example of a prior art transmitter configuration for use in such a dual mode terminal has been disclosed in the above-mentioned patent document 1. In this configuration, the phase control loop is used (the power amplifier gain is fixed) during GSM operation and both the phase control loop and the amplitude control loop are used during EDGE operation. By the amplitude control loop operation, the amplitude of an output signal from the power amplifier is controlled to change with the envelope of the nonconstant envelope 8PSK modulation.

As described above, in the prior art transmitter configuration, the gain of the power amplifier is controlled by the amplitude control loop. As an arrangement to supersede this, prior to the present invention, one of the inventors of the present invention considered a configuration in which a variable gain amplifier for small power is connected in front of the power amplifier with fixed gain.

Circuitry of this variable gain amplifier (hereinafter denoted as "VGA") is shown in FIG. 22. The VGA is comprised of a VGA body (hereinafter denoted as "VGAB") 200, a switch with two inputs and one output (hereinafter denoted as "DSW") 202a, and an operational amplifier (hereinafter denoted as "OPAMP") 205. The VGAB 200 is composed of a P-type MOS transistor MP3a, an N-type MOS transistor MN3a, a resistor R3a, and capacitors C3a and C3b.

The transistors MP3a and MN3a constitute an inverter and are self-biased by the resistor R3a. A signal that is input at an input terminal RFIN is amplified and output from an output terminal RFOUT. A reference voltage DC with a fixed potential is input to one input of the DSW 202a and a signal AMSIG whose amplitude changes with the envelope of nonconstant envelope modulation is input to the other input. Output of the DSW202a is connected to a noninverting input terminal of the OPAMP 205. Output of the OPAMP 205 is connected to its inverting input terminal and the OPAMP 205 constitutes a noninverting amplifier. The output of the OPAMP 205 is connected to a source terminal of the transistor MP3a, that is, a supply voltage terminal Pt of the VGAB 200.

In the case of nonconstant envelope modulation, the DSW 202a outputs the signal AMSIG which changes the potential of the supply voltage terminal Pt, thereby the VGA gain is controlled. As a result, good linearity is maintained over a gain variable range. Besides, the VGA can be realized with a simple structure. On the other hand, in the case of constant envelope modulation, the DSW 202a outputs the reference voltage DC which fixes the potential of the supply voltage terminal Pt. As a result, the VGA operates as a fixed gain amplifier.

The characteristics, e.g., threshold voltages of the above transistors MP3a and/or MN3a may vary due to variance in the manufacturing process or for other reason. This variation has an effect on the gain that should remain constant during constant envelope modulation, when the potential of the supply voltage terminal Pt is kept constant. Such effect on the gain takes place due to a variation in the rate of converting a change in the potential difference between the gate and source of the transistors MP3a and MN3a involved during the transmission of an input signal from the input terminal RFIN into a change in the drain current which is output from the output terminal, in short, a variation in transconductance of the transistors MP3a and MN3a. Gain variation is reduced by increasing consumption current and increasing the level of input signals to the VGA to a sufficiently high level. However, the consumption current must be increased more, as the characteristic variance becomes more significant. Needless to explain, the VGA gain variation varies the output power of the transmitter.

An object of the present invention is to provide a transmitter employing variable gain amplifiers, operating with both constant and nonconstant envelope modulation systems, and with little variation in the transmitting power when constant envelope modulation is performed, or a mobile communication terminal using such transmitter.

The above object of the present invention can be achieved effectively by providing a bias control loop in a variable gain amplifier. The variable gain amplifier comprises a variable gain amplifier body having a supply voltage terminal and a bias current detection terminal for extracting a bias current corresponding to a gain, wherein the gain changes with a change in the potential of the supply voltage terminal, and a bias control unit connected to the supply voltage terminal and the bias current detection terminal. Thereby, the bias control loop is provided comprising the variable gain amplifier body and the bias control unit to control the bias current so that the gain in the case of constant envelope modulation becomes a predetermined value. By adopting this means, variation in the gain of the variable gain amplifier is suppressed by the control loop when a transmit signal is modulated by constant envelope modulation. Therefore, a transmitter capable of operating with constant and nonconstant envelope modulation systems and with little variation in the transmitting power can be realized.

These and other objects and many of the attendant advantages of the invention will be readily appreciated as the same becomes better understood by reference to the following detailed description when considered in connection with the accompanying drawings.

DETAILED DESCRIPTION OF THE PREFERRED EMBODIMENTS

Figure 1:
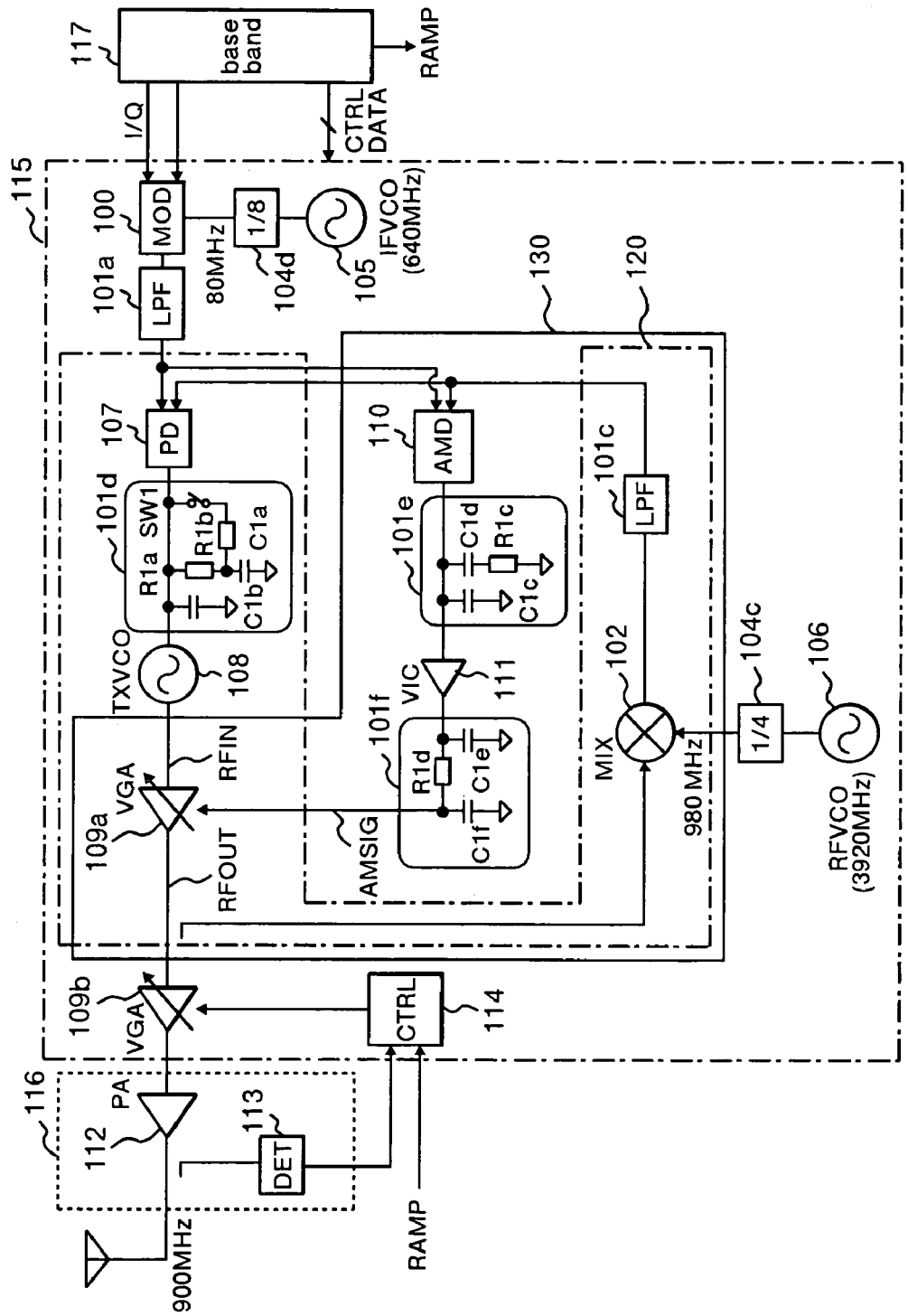
FIG. 1 is a circuit diagram for explaining a first embodiment of a transmitter of the present invention.

A transmitter of the present invention and a mobile communication terminal using it will be described more fully hereinafter with reference to a number of embodiments shown in the drawings. In all drawings which are used to explain the embodiments, the same reference numerals are used to identify the same or similar elements.

Figure 2:
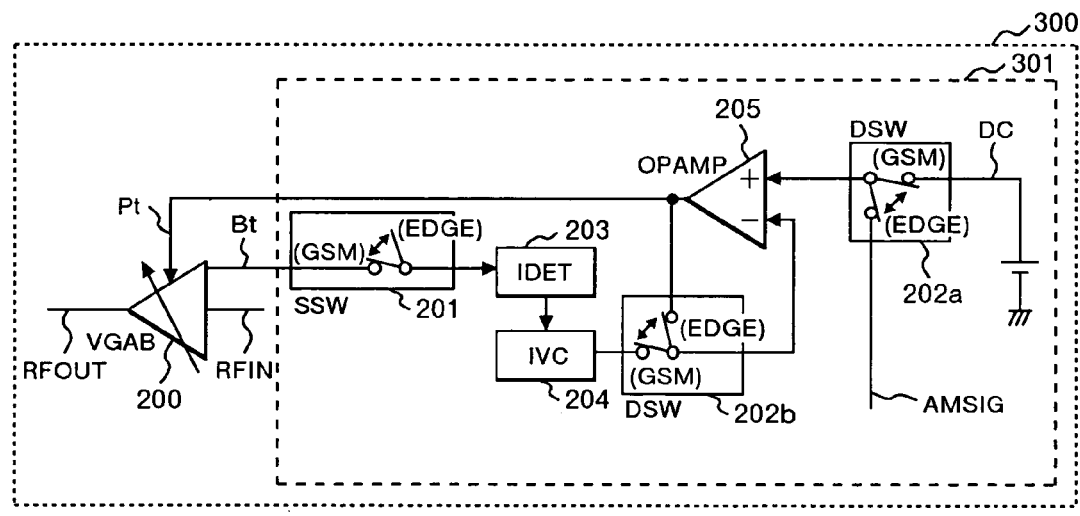
FIG. 2 is a circuit diagram for explaining an example of a configuration of a variable gain amplifier employed in the first embodiment of the present invention.

FIG. 1 and FIG. 2 show a first embodiment of a transmitter of the present invention. The transmitter of the first embodiment shown in FIG. 1 includes a VGA (variable gain amplifier) involved in the present invention, shown in FIG. 2.

In FIG. 2, the VGA is comprised of a VGAB (variable gain amplifier body) 200, an OPAMP (operational amplifier) 205 which supplies a gain control signal, which is generated, based on a signal AMSIG whose amplitude changes with the envelope of nonconstant envelope modulation, to the VGAB 200, a DSW (a switch with two inputs and one output) 202a which switches the OPAMP 205 operation between GSM and EDGE, and four circuits which will be mentioned below. Here, the VGAB 200 has an input terminal RFIN, an output terminal RFOUT, a supply voltage terminal Pt at which the gain control signal is input, and a bias current detection terminal Bt. The four circuits are a current detector (hereinafter denoted as "IDET") 203 which detects a bias current flowing in the VGAB 200 when being connected to the bias current detection terminal Bt of the VGAB 200, a switch with one input and one output (hereinafter denoted as "SSW") 201 which makes a connection between the bias current detection terminal Bt and the current detector 203 when in GSM mode and disconnects the connection when in EDGE mode, a current-voltage converter (hereinafter denoted as "IVC") 204 which converts the bias current detected by the IDET 203 into a voltage, and a DSW 202b which switches connection based on modulation. A bias control block (bias control unit) 301 is composed of the OPAMP 205, the DSW 202a, and the above four circuits. A bias control loop 300 is composed of the VGAB 200 and the bias control block 301.

The DSW 202a supplies fixed potential DC to a noninverting input terminal of the OPAMP 205 when in GSM mode and supplies the signal AMSIG to the same terminal when in EDGE mode. The DSW 202b supplies the output voltage of the IVC 204 to an inverting input terminal of the OPAMP 205 when in GSM mode and supplies a gain control signal which is the output signal of the OPAMP 205 to the same terminal when in EDGE mode.

First, in the case of nonconstant envelope modulation in EDGE mode, the DSW 202a outputs the signal AMSIG, the DSW 202b makes a connection between the output of the OPAMP 205 and its inverting input terminal, and the SSW 201 is open. As a result, the gain of the VGAB 200 is controlled so that the amplitude of the output of the VGA changes with the envelope.

On the other hand, in the case of constant envelope modulation in GSM mode, the DSW 202a outputs the fixed potential DC, the DSW 202b makes a connection between the output of the IVC 204 and the inverting input terminal of the OPAMP 205, the SSW 201a is closed, and a feedback loop for the bias current flowing in the VGAB 200 (bias control loop) is formed. By the feedback loop, the output potential of the IVC 204 is controlled to be equal to the fixed potential DC. As a result, a constant bias current flows in the VGAB 200 with a constant transconductance, which reduces variation in the output level of the VGA.

The transmitter of the first embodiment shown in FIG. 1 is configured, using the VGA configured as above, involved in the present invention. The transmitter of the first embodiment is comprised of a first carrier frequency generating circuit, a second carrier frequency generating circuit, a phase control loop (hereinafter denoted as "PM loop"), an amplitude control loop for changing amplitude with the envelope (hereinafter denoted as "AM loop"), a quadrature modulator (hereinafter denoted as "MOD") 100, a low-pass filter (hereinafter denoted as "LPF") 110a, a VGA 109b, a power amplifier (hereinafter denoted as "PA") 112, an output signal detector 113, and a control circuit 114.

The first carrier frequency generating circuit is composed of an intermediate-frequency voltage-controlled oscillator (hereinafter denoted as "IFVCO") 105 and a divide-by-8 divider (⅛) 104d.

The second carrier frequency generating circuit is composed of a radio-frequency (RF) voltage-controlled oscillator (hereinafter denoted as "RFVCO") 106 and a divide-by-4 divider (¼) 104c.

The PM loop 120 is composed of a phase comparator (hereinafter denoted as "PD") 107, an LPF 101d, a transmitting-frequency voltage-controlled oscillator (hereinafter denoted as "TXVCO") 108, a VGA 109a, a mixer 102, and an LPF 101c.

The AM loop 130 is composed of an envelope comparator (hereinafter denoted as "AMD") 110, an LPF 101e, a voltage-current converter (hereinafter denoted as "VIC") 111, an LPF 101f, the VGA 109a, the mixer 102, and the LPF 101c.

A transmitting circuit 115 comprising the first carrier frequency generating circuit, second carrier frequency generating circuit, PM loop 120, AM loop 130, LPF 101a, MOD 100, VGA 109a and control circuit 114 is integrated as a semiconductor integrated circuit (RF-IC: RF-Integrated Circuit). A transmit output circuit 116 comprising the PA 112 and output signal detector 113 is integrated into a module. As above, the transmitter 1 of the first embodiment consists of the transmitting circuit 115 and the transmit output circuit 116.

In the first embodiment, the VGA shown in FIG. 2 is employed as the VGA 109a.

Here, the LPF 101d consists of resistors R1a, R1b, capacitors C1a, C1b, and a switch SW1. The switch SW1 is used to change the filter's cutoff frequency between GSM and EDGE. The LPF 101e consists of a resistor R1c and capacitors C1c, C1d. The LPF 101f consists of a resistor R1d and capacitors C1e, C1f.

Then, how the transmitter configured as above operates will be described. First, in EDGE mode when an in-phase component (hereinafter denoted as "I") and a quadrature component (hereinafter denoted as "Q") of baseband signal which are output by a baseband circuit 117 undergo nonconstant envelope modulation, the I and Q baseband signals (I/Q) are converted into a signal with a first carrier frequency as the center frequency by the quadrature converter 100 and an unwanted signal is suppressed by the LPF 110a. An output signal of the LPF 110a becomes a reference signal that is input to the PD 107 and AMD 110.

By the PM loop 120, the reference signal and a feedback signal passing via the LPF 101c to the PD 107 are controlled to have the same phase and frequency. That is, the phase control loop synchronizes with the phase of the reference signal generated from the input signal. As a result, at the output of the VGA 109a, the phase (or a frequency-modulated component) included in the reference signal is reproduced as phase information and the center frequency is converted into a desired frequency that is determined by the first and second carrier frequencies. When the output frequency of the IFVCO 105 is, for example, 640 MHz, the first carrier frequency will be 80 MHz and the center frequency of the reference signal also will be 80 MHz. Thus, the center frequency of the feedback signal to the PD 107 will be 80 MHz. On the other hand, if the frequency of the RFVCO 106 is 3920 MHz, the second carrier frequency will be 980 MHz. Because the center frequency of the output signal of the VGA 109a is converted into 80 MHz by the mixer 102, eventually, the center frequency of the output signal of the VGA 109a will be 900 MHz.

Similarly, by the AM loop 130, the reference signal and the feedback signal passing via the LPF 101c to the AMD 110 are controlled to have the same envelope; that is, the AM loop follows the amplitude of the envelope of the reference signal. As a result, at the output of the VGA 109a, the envelope included in the reference signal is reproduced as envelope information. The amplitude of the output signal of the TXVCO 108 is constant and reproducing the envelope is realized by controlling the gain of the VGA 109a. The variable gain range of the VGA 109a supports the envelope variation of the modulated signal and this range is about 18 dB in the case of EDGE. The VGA 109a is realized with simple circuitry as shown in FIG. 2.

Then, in GSM mode when the I and Q baseband signals which are output by the baseband circuit 117 undergo constant envelope modulation, circuits in the AM loop 130 which are necessary for the above AM loop operation and which are not in common to the PM loop 120, namely, the AMD 110 and VIC 111 are set inoperative. Moreover, the VGA 109a operates as a fixed gain amplifier. The PM loop 120 operates as described above and the reference signal and the feedback signal passing via the LPF 101c to the PD 107 are controlled to have the same phase and frequency.

As described above, the VGA 109a is shared by the PM loop 120 and AM loop 130 and combines phase information that the PM loop 120 outputs and envelope information that the AM loop outputs by gain control.

In GSM and EDGE modes, the antenna output power is required to be variable in a range of at least 40 dB. The output power can be varied in the range of 40 dB by using the VGA 109b. The VGA 109b is a linear amplifier with a variable gain range of 40 dB or more. The antenna output power is controlled by using the detector 113 and control circuit 114. The output power of the PA 112 is detected by the detector 113 and the detector 113 outputs a detected signal. The detected signal is compared to a reference signal RAMP that is output by the baseband circuit 117 and the control circuit 114 generates a gain control signal to the VGA 109b so that the detected signal and the reference signal RAMP will match. In this way, the VGA 109b, PA 112, detector 113, and control circuit 114 form an antenna output power control loop. The reference signal RAMP is not always to be an analog signal and may be a digital signal. In that case, a digital/analog converter is prepared.

In this way, because variable gain range that is required to control the antenna output power is provided by the VGA 109b, the PA 112 is only required to have a sufficient linear characteristic with fixed gain. Therefore, there is no need to add a special function to the PA 112 for transmitter realization and a general-purpose power amplifier can be employed as the PA 112. However, some characteristic of the PA 112, for example, gain may change between when the transmitter operates in GSM mode and when it operates in EDGE mode.

The baseband circuit 117 performs intended control by supplying a control signal (CTRL DATA) to the transmitting circuit 115.

Figure 3:
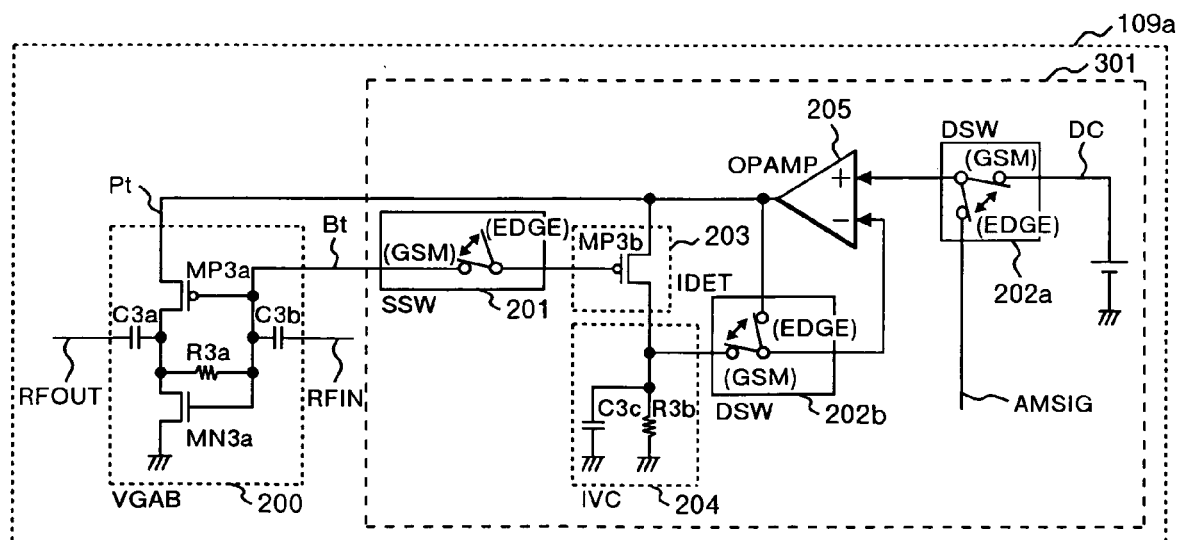
FIG. 3 is a circuit diagram for explaining a circuit example of the variable gain amplifier employed in the first embodiment of the present invention.

Details of the components of the VGA 109a shown in FIG. 2 will be described below. FIG. 3 shows the VGA 109a of the first embodiment including examples of the VGAB 200, IDET 203, and IVC 204 circuits.

The VGAB 200 is comprised of a P-type MOS transistor MP3a, an N-type MOS transistor MN3a, capacitors C3a, C3b, and a resistor R3a. The transistors MP3a and MN3a constitute an inverter circuit and are self-biased by the resistor R3a. A signal that is input at the input terminal RFIN is amplified and output from the output terminal RFOUT. Gain control is performed by changing the source potential of the transistor MP3a (potential of the supply voltage terminal Pt), namely, the supply potential.

The IDET 203 consists of a P-type MOS transistor MP3b. The transistor MP3b and the transistor MP3a constitute a current mirror via the SSW 201 and the transistor MP3b outputs a current that is proportional to the current flowing in the VGAB 200.

The IVC 204 consists of a resistor R3b and a capacitor C3c connected in parallel. One terminals of the resistor R3b and capacitor C3c are grounded and the other terminals are connected to the output of the IDET 203 and further connected to the DSW 202b. The AC component of the output current from the IDET 203 is eliminated by the capacitor C3c and a voltage that is proportional to the bias current flowing in the VGAB 200 is generated across the resistor R3b.

Figures 4, 5:
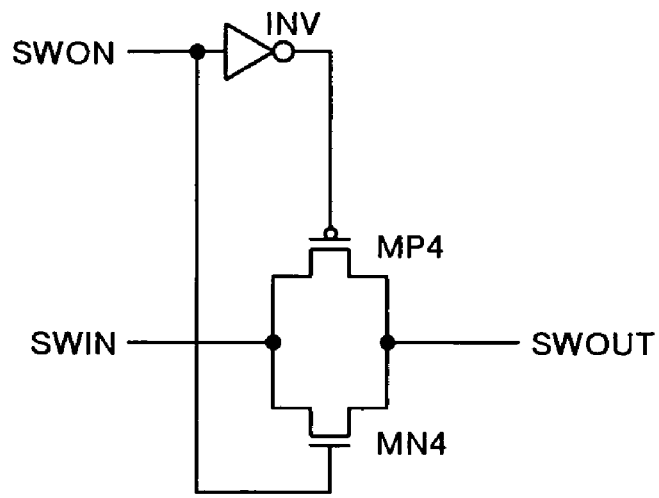
FIG. 4 is a circuit diagram for explaining a circuit example of a switch with one input and one output, employed in the first embodiment of the present invention.
FIG. 5 is an example of operation of the switch with one input and one output shown in FIG. 4.

Next, a circuit example of the SSW 201 is shown in FIG. 4. The SSW 201 is comprised of a P-type MOS transistor MP4, an N-type MOS transistor MN4, and an inverter INV. An Input terminal SWIN is connected to a source terminal of the transistor MP4 and a drain terminal of the transistor MN4. An output terminal SWOUT is connected to a drain terminal of the transistor MP4 and a source terminal of the transistor MN4. A control terminal SWON is connected to a gate terminal of the transistor MN4 and an input terminal of the inverter INV and the output of the inverter INV is connected to a gate terminal of the transistor MP4.

First, when the potential of the control terminal SWON is the supply voltage, the transistor MN4 operates in the triode region, whereas the gate of the transistor MP4 is brought to the ground potential GND by the inverter INV, and the transistor MP4 also operates in the triode region, providing a short circuit between the terminal SWIN and the terminal SWOUT. Conversely, when the potential of the control terminal SWON is GND (ground), both the transistors NN4 and MP4 do not operate, providing an open condition between the terminal SWIN and the terminal SWOUT. The above-described operation of the SSW 201 is summarized in FIG. 5.

Figures 6, 7:
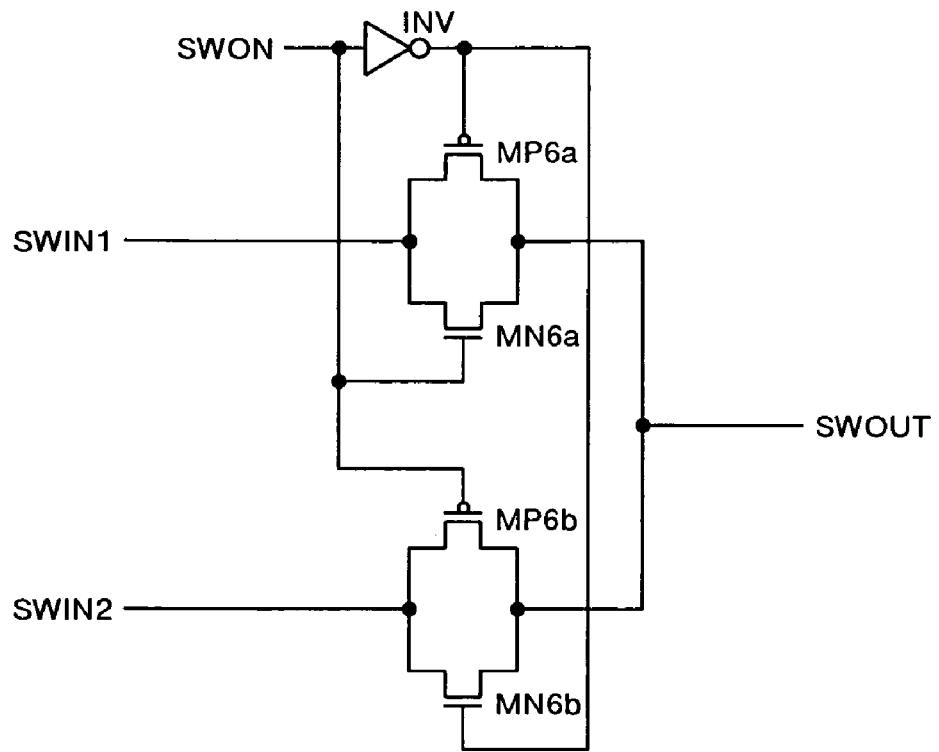
FIG. 6 is a circuit example of switches with two inputs and one output, employed in the first embodiment of the present invention.
FIG. 7 is an example of operation of the switches with two inputs and one output shown in FIG. 6.

Then, a circuit example of the DSW 202a and DSW 202b is shown in FIG. 6. The DSW 202a and DSW 202b are, respectively, comprised of P-type MOS transistors MP6a, MP6b, N-type MOS transistors MN6a, MN6b, and an inverter INV. One input terminal SWIN1 is connected to a source terminal of the transistor MP6a and a drain terminal of the transistor MN6a. The other input terminal SWIN2 is connected to a source terminal of the transistor MP6b and a drain terminal of the transistor MN6b. An output terminal SWOUT is connected to the drain terminals of the transistors MP6a and MP6b and the source terminals of the source terminals of the transistors MN6a and MN6b. A control terminal SWON is connected to the gate terminals of the transistors MN6a and MP6b and an input terminal of the inverter INV and the output of the inverter INV is connected to the gate terminals of the transistors MP6a and MN6b.

First, when the potential of the control terminal SWON is the supply voltage, the transistors MN6a and MP6a operate in the triode region, whereas the transistors MN6b and MP6b do not operate, which provides a short circuit between the input terminal SWIN1 and the output terminal SWOUT and an open condition between the input terminal SWIN2 and the output terminal SWOUT. Conversely, when the potential of the control terminal SWON is GND, the transistors MN6b and MP6b operates in the triode region, whereas the transistors MN6a and MP6a do not operate, which provides a short circuit between the input terminal SWIN2 and the output terminal SWOUT and a open condition between the input terminal SWIN1 and the output terminal SWOUT. The above-described operation of the DSW 202a and DSW 202b is summarized in FIG. 7.

By the operations of the components described above, in GSM mode when constant envelope modulation is performed, the DSW 202a outputs fixed potential DC, the DSW 202b makes a connection between the output of the IVC 203 and the inverting input terminal of the OPAMP 205, the SSW 201a is closed, and a feedback loop for the bias current flowing in the VGAB 200 is formed. By the feedback loop, the output potential of the IVC 204 is controlled to be equal to the fixed potential DC. As a result, in the VGAB 200, a constant bias current flows through the transistor MP3a which forms a current mirror with the IDET 203 and a constant transconductance is obtained, and thereby variation in the output level of the VGA is reduced.

The above switches (SSW 201, DSW 202a, and DSW 202b) are not necessarily embodied in switches and it is needless to say that they are only required to be able to make or break connections between the OPAMP 205, VGA 200, IDET 203, and IVC 204, when appropriate. Even if they are embodied in switches, they are not limited to the examples shown in FIGS. 4 and 6.

Figure 8:
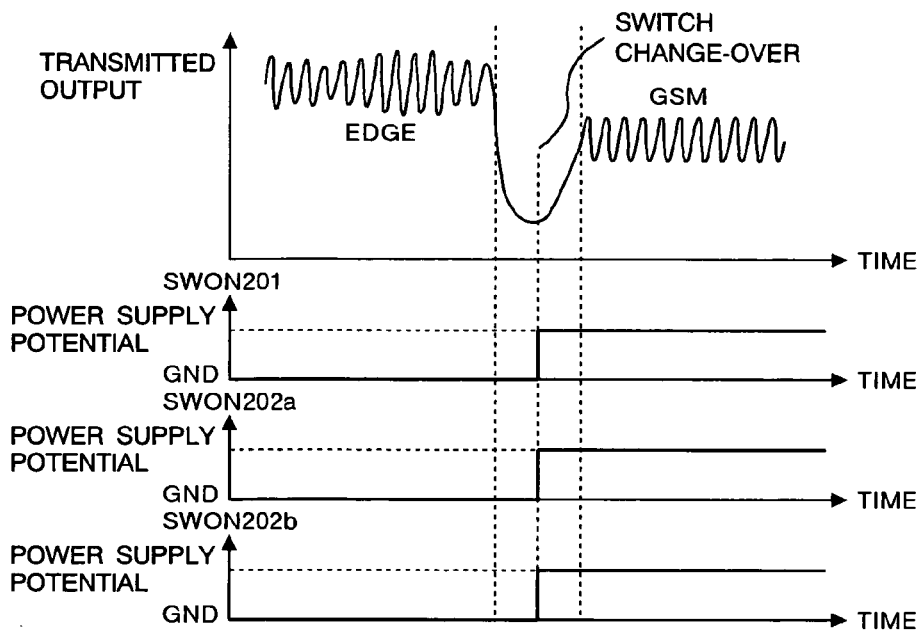
FIG. 8 is a chart for explaining changeover timing of the switches employed in the first embodiment of the present invention.

FIG. 8 shows an example of timing when the switches (SSW 201, DSW 202a, DSW 202b) change over. Control signals SWON201, SWON202a, and SWON202b are applied to the SSW 201, DSW 202a, and DSW 202b, respectively. FIG. 8 is provided, assuming that: DC and signal AMSIG are applied, respectively, to the input terminals SWIN1 and SWIN2 of the DSW 202a; and the output of the IVC 203 and the output of the OPAMP 205 are input, respectively, to the input terminals SWIN1 and SWIN2 of the DSW 202b. The control signals SWON201, SWON202a, and SWON202b simultaneously change from ground (GND) to supply potential in the middle of changeover from EDGE to GSM.

The above changeover timing is one example. The above switches may be at least required to change over before the transmission state when one modulation system changes to another and do not necessarily change over simultaneously. If one modulation system changes to another during transmission, the switches may be at least required to change over within the transition time.

Figure 9:
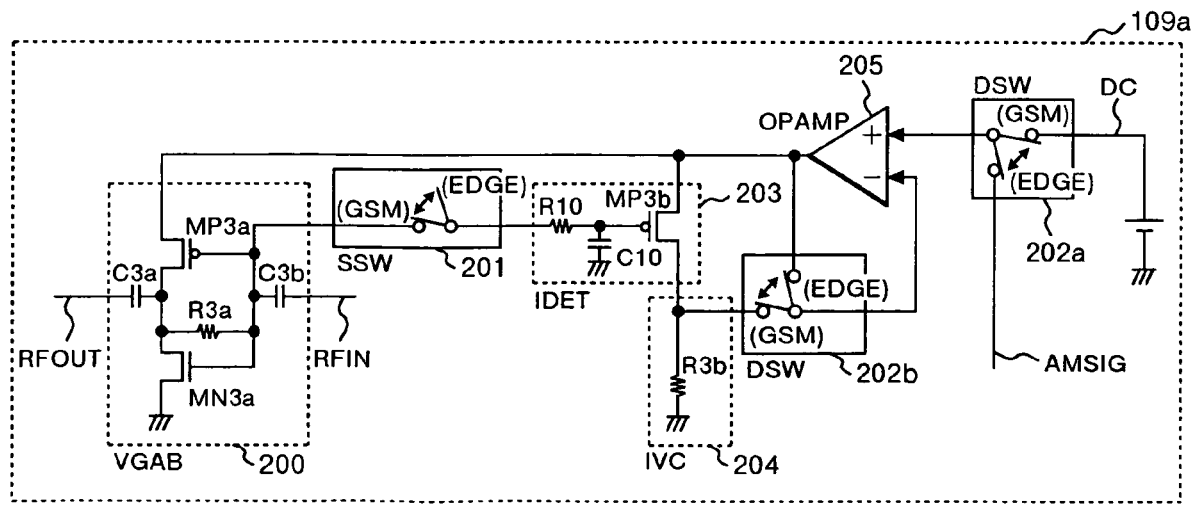
FIG. 9 is a circuit diagram for explaining another circuit example of the variable gain amplifier employed in the first embodiment of the present invention.

It is possible to move the circuit element for eliminating the AC component in the IVC 204 shown in FIG. 3 to the side of the gate of the IDET 203. The so-modified VGA 109a is shown in FIG. 9. In FIG. 9, an LPF consisting of a resistor R10 and a capacitor C10 is connected to the gate of the transistor MP3b of the IDET 203. The IVC 204 consists entirely of the resistor R3b. For the IVC 204 shown in FIG. 3, current-voltage conversion gain is determined by the resistance value of the resistor R3b and the capacitance value of the capacitor C3c is determined from this resistance value and the cutoff frequency required to eliminate the AC component. In FIG. 9, because the cutoff frequency is determined by the resistance value of the resistor R10 and the capacitance value of the capacitor C10, it becomes possible to decrease the capacitance value of the capacitor C10 by increasing the resistance value of the resistor R10.

Moreover, it is possible to connect a resistor R13 in series to the capacitor C3c in the IVC 204 shown in FIG. 3. The VGA 109a in which the IVC 204 is so modified is show in FIG. 10. In comparison with the configuration of FIG. 3, as the result of the provision of the resistor R13, the effect of eliminating the high-frequency component somewhat decreases, but the effect of providing a larger phase margin in the feedback loop for keeping the current flowing in the VGA 200 constant is obtained.

Figure 11:
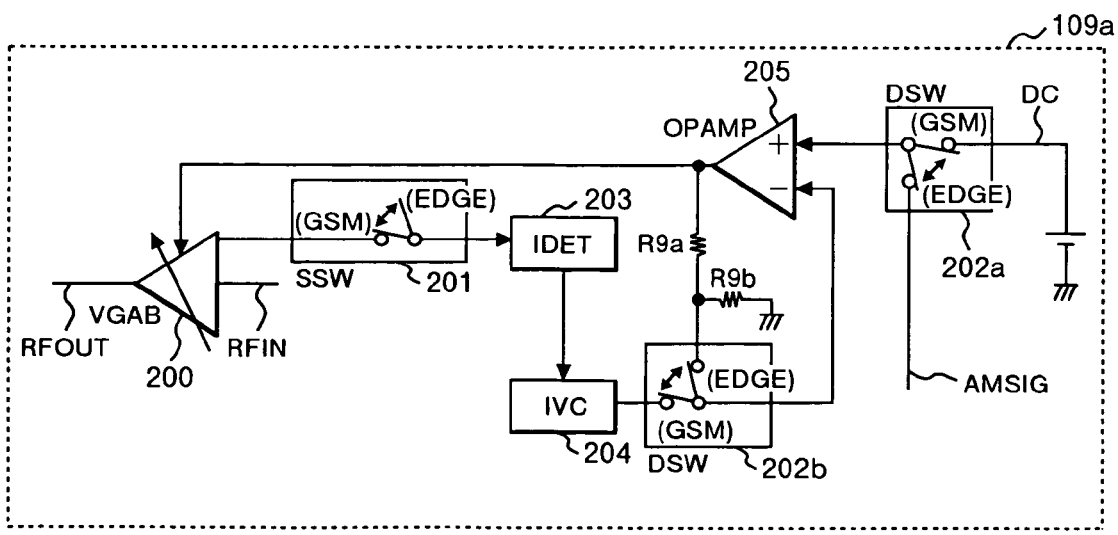
FIG. 11 is a circuit diagram for explaining a circuit example of a variable gain amplifier employed in a second embodiment of the present invention.

A second embodiment of a transmitter of the present invention will be described with FIG. 11. In the second embodiment, the VGA shown in FIG. 2, which is employed as the VGA 109a, is modified such that an OPAMP 205a is configured so that a gain of one or more times can be set. The so-modified VGA 109a employed in the second embodiment is shown in FIG. 11. In FIG. 11, the output of the OPAMP 205 is connected via a resistor R9a to the input of the DSW 202b and a terminal on the DSW 202b side of the resistor R9a is grounded via a resistor R9b.

In the case of nonconstant envelope modulation in the first embodiment, the gain of the OPAMP 205 which is a noninverting amplifier is 1, whereas, in the second embodiment, the gain becomes $1+R_A/R_B$, where $R_A$ and $R_B$ denote the resistance values of the resistors R9a and R9b, respectively. In consequence, the AM loop characteristic that is determined by the product of the gains of the circuits constituting the AM loop can be varied as required.

Figure 12:
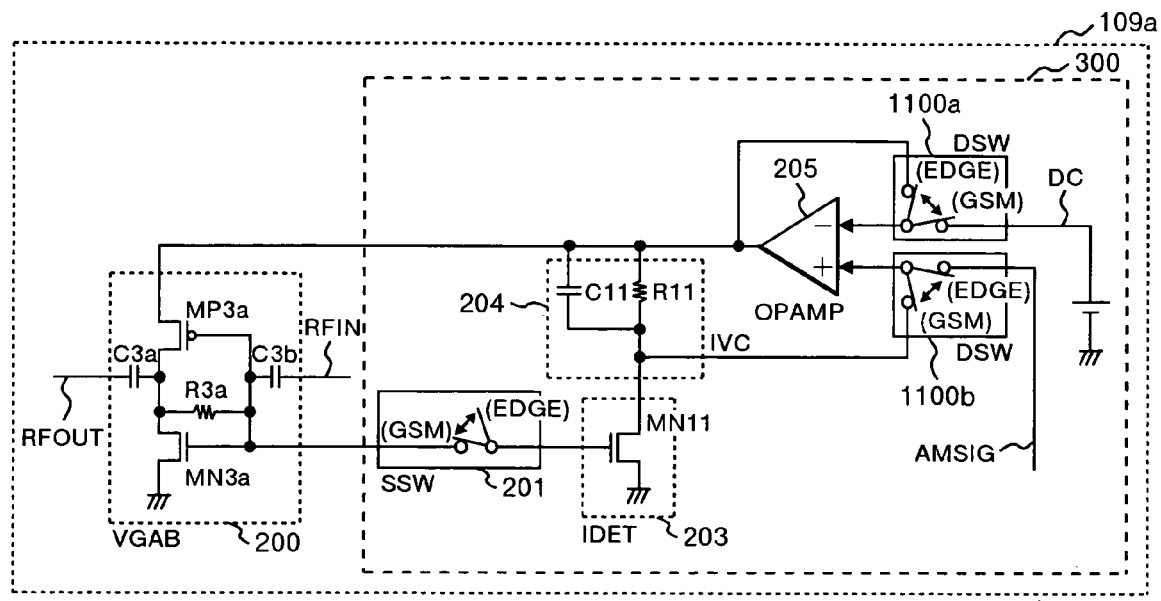
FIG. 12 is a circuit diagram for explaining a circuit example of a variable gain amplifier employed in a third embodiment of the present invention.

A third embodiment of a transmitter of the present invention will be described with FIG. 12. In the third embodiment, a VGA in which an N-type MOS transistor is employed in the current detector, which is shown in FIG. 12, is employed as the VGA 109a. In FIG. 12, although the VGAB 200 is the same as that in the first embodiment, the IDET 203 consists of the N-type MOS transistor MN11. The transistor MN11 and the transistor MN3a constitute a current mirror via the SSW 201 and the transistor MN11 outputs a current that is proportional to the current flowing in the VGAB 200. A resistor R11 and a capacitor C11 constituting the IVC 204 are connected to the source of the transistor MP3a. The fixed potential DC and the output of the OPAMP 205 are input to a DSW 1100a and the output of the DSW 1100a is connected to an inverting input terminal of the OPAMP 205. The signal AMSIG and the output of the IVC 204 are input to a DSW 1100b and the output of the DSW 1100b is connected to noninverting input terminal of the OPAMP 205.

In the case of nonconstant envelope modulation, the VGA operates the same as in the first embodiment. On the other hand, in the case of constant envelope modulation, the fixed potential DC is input to the inverting input terminal of the OPAMP 205 and the output signal of the IVC 204 is input to the noninverting input terminal of the OPAMP 205. Since the output potential of the IVC 204 decreases as the bias current flowing in the VGA 200 increases, a feedback loop is formed by inverting the polarity of the OPAMP 205, unlike the case of the first embodiment. As a result, in the VGAB 200, a constant bias current flows through the transistor MN3a which forms a current mirror with the IDET 203 and a constant transconductance is obtained, and thereby variation in the output level of the VGA is reduced.

Although not shown, it is possible to connect a resistor between the output of the OPAMP 205 and the input of the DSW 1100a and connect another resistor between the input of the DSW 1100a and the ground, as is the case for the second embodiment. In consequence of this modification, when applied, the AM loop characteristic that is determined by the product of the gains of the circuits constituting the AM loop can be varied as required.

Although not shown, as is the case for FIG. 9 for the first embodiment, it is possible to connect a resistor between the SSW 201 and the gate of the transistor MN11 and connect a capacitor between this gate and the ground, while removing the capacitor C11 from the IVC 204. By this modification, it becomes possible to decrease the capacitance value of the capacitor connected to the gate by increasing the resistance value of the resistor between the SSW 201 and the gate of the transistor MN11, whereas, for the IVC 204 shown in FIG. 12, current-voltage conversion gain is determined by the resistance value of the resistor R11 and the capacitance value of the capacitor C11 is determined from this resistance value and the cutoff frequency required to eliminate the AC component.

Figure 10:
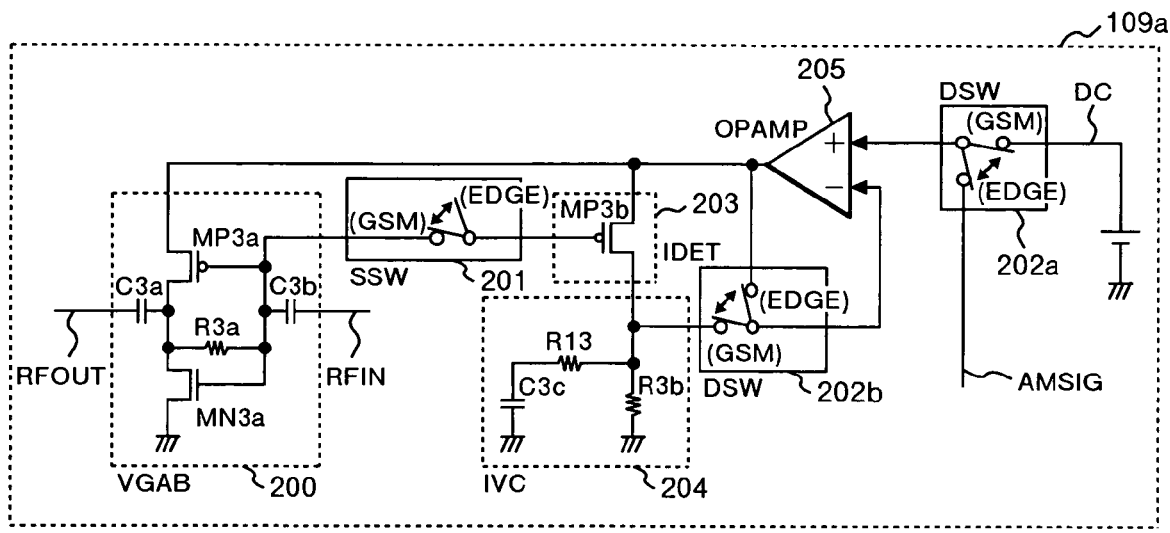
FIG. 10 is a circuit diagram for explaining yet another circuit example of the variable gain amplifier employed in the first embodiment of the present invention.

Furthermore, although not shown, as is the case for FIG. 10 for the first embodiment, it is possible to connect a resistor in series to the capacitor C11. By this modification, the effect of providing a larger phase margin in the feedback loop for keeping the current flowing in the VGA 200 constant is obtained.

Figure 13:
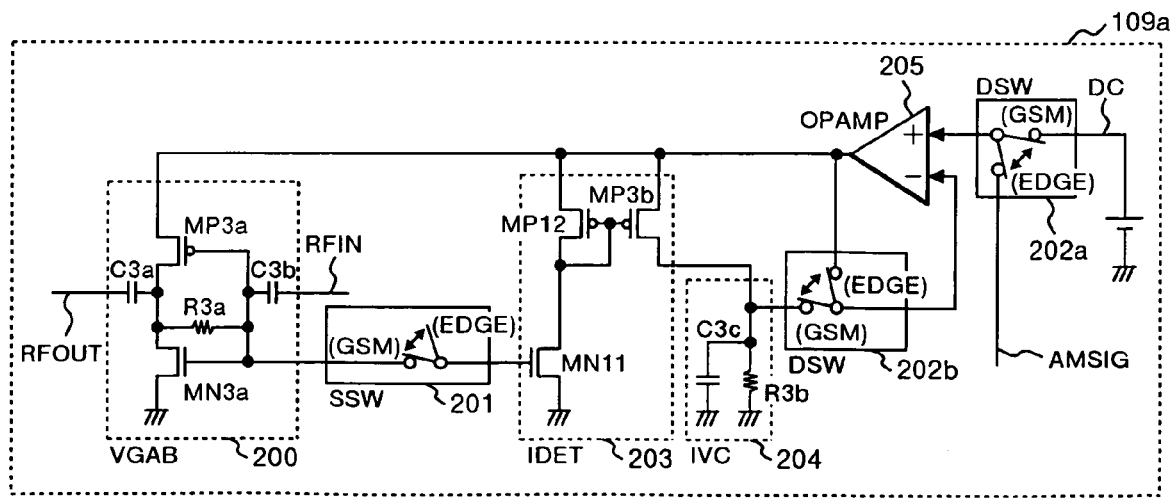
FIG. 13 is a circuit diagram for explaining a circuit example of a variable gain amplifier employed in a fourth embodiment of the present invention.

A fourth embodiment of a transmitter of the present invention will be described with FIG. 13. In the fourth embodiment, the VGA 109a shown in FIG. 3 is modified such that the IDET 203 is configured with cascaded current mirrors. Other circuits the same as in the first embodiment. The so-modified VGA 109a employed in the fourth embodiment is shown in FIG. 13. In FIG. 13, the IDET 203 is composed of an N-type MOS transistor MN11 and P-type MOS transistors MP3b and MP12. The transistor MN11 and the transistor MN3a constitute a current mirror and the transistor MP3b and the transistor MP12 constitute another current mirror. While the polarity of the OPAMP 205 is inverted in the third embodiment, a feedback loop is formed in the same way as for the first and second embodiments without inverting the polarity of the OPAMP 205 in the fourth embodiment. In the VGAB 200, a constant bias current flows through the transistor MN3a which forms a current mirror with the IDET 203 and a constant transconductance is obtained, and thereby variation in the output level of the VGA is reduced.

Although not shown, it is possible to connect a resistor in series to the capacitor C3c in FIG. 13. By this modification, the effect of providing a larger phase margin in the feedback loop for keeping the current flowing in the VGA 200 constant is obtained.

Figure 14:
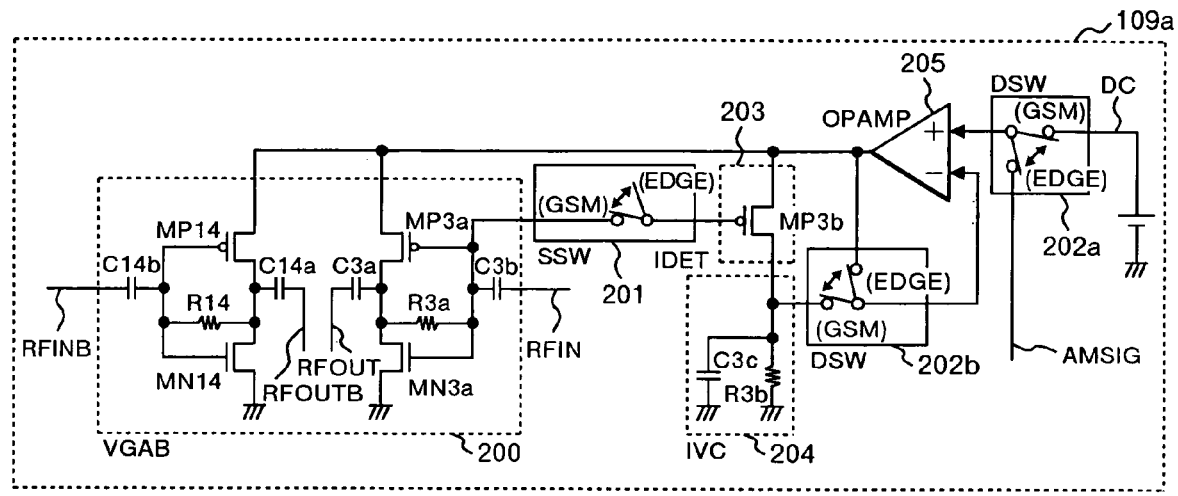
FIG. 14 is a circuit diagram for explaining a circuit example of a variable gain amplifier employed in a fifth embodiment of the present invention.

A fifth embodiment of a transmitter of the present invention will be described with FIG. 14. In the fifth embodiment, the VGA 109a shown in FIG. 3 is modified such that the VGAB 200 is configured as a differential type. Other circuits are the same as in the first embodiment. The so-modified VGA 109a employed in the fifth embodiment is shown in FIG. 14. The VGAB 200 shown in FIG. 14 is configured as a differential amplifier in which a P-type MOS transistor MP14, an N-type MOS transistor MN14, a resistor R14, and capacitors C14a and C14b are added to the VGAB 200 shown in FIG. 3. Differential input signals are input from terminals RFIN and RFINB and differential output signals are output from terminals RFOUT and RFOUTB. Gain control is performed by the potentials of the sources of the transistor MP3P and the transistor MP14. In comparison with the VGA 109a of the first embodiment shown in FIG. 3, common mode noise rejection is enhanced by the differential configuration, though the circuit size increases.

Figure 15:
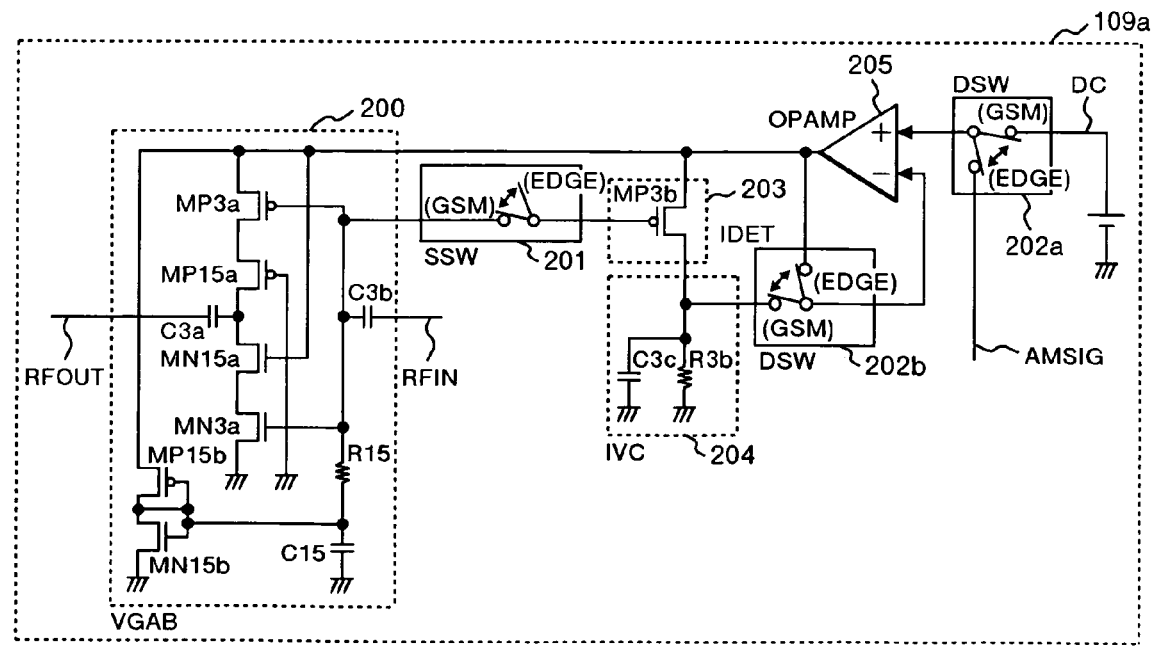
FIG. 15 is a circuit diagram for explaining a circuit example of a variable gain amplifier employed in a sixth embodiment of the present invention.

A sixth embodiment of a transmitter of the present invention will be described with FIG. 15. In the sixth embodiment, the VGA 109a shown in FIG. 3 is modified such that additional transistors are connected in series to the transistors in the VGAB 200 and a bias circuit is added to the VGAB 200. Other circuits are the same as in the first embodiment. The so-modified VGA 109a employed in the sixth embodiment is shown in FIG. 15. In the VGAB 200 shown in FIG. 15, a resistor R3a is removed and a P-type MOS transistor MP15b, an N-type MOS transistor MN15b, a resistor R15, and a capacitor C15 which constitute a bias circuit are added to the VGAB 200 shown in FIG. 3. Moreover, an N-type MOS transistor MN15a is attached in series to the transistor MN3a and a P-type MOS transistor MP15a is attached in series to the transistor MP3a. In comparison with the first embodiment employing the VGA 109a shown in FIG. 3, when the VGA 200 gain is low in the case of nonconstant envelope modulation, an effect of extending the gain variable range of the VGA 109a is expected, which is obtained by reducing signal leakage through gate-drain parasitic capacitances of the transistor MP3a and the transistor MN3a and eliminating signal leakage through a self-bias resistor.

Figure 16:
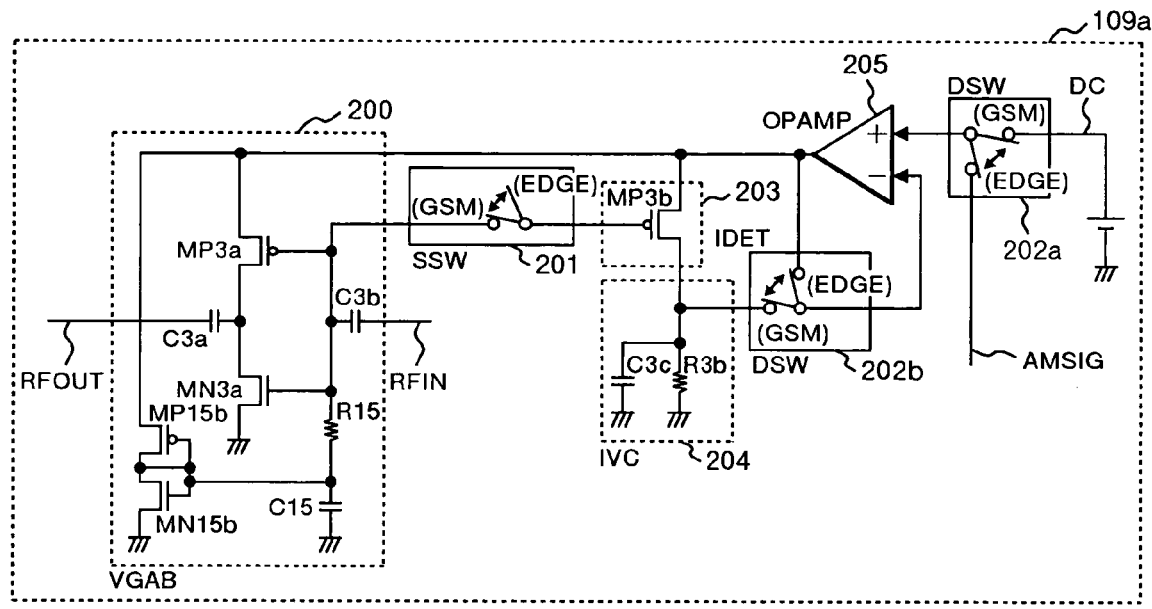
FIG. 16 is a circuit diagram for explaining a circuit example of a variable gain amplifier employed in a seventh embodiment of the present invention.

A seventh embodiment of a transmitter of the present invention will be described with FIG. 16. In the seventh embodiment, the VGA 109a shown in FIG. 3 is modified such that a bias circuit is added to the VGAB 200. Other circuits are the same as in the first embodiment. The so-modified VGA 109a employed in the seventh embodiment is shown in FIG. 16. In the VGAB 200 shown in FIG. 16, a resistor R3a is removed and a P-type MOS transistor MP15b, an N-type MOS transistor MN15b, a resistor R15, and a capacitor C15 which constitute a bias circuit are added to the VGAB 200 shown in FIG. 3. In comparison with the first embodiment shown in FIG. 3, when the VGA 200 gain is low in the case of nonconstant envelope modulation, an effect of extending the gain variable range of the VGA 109a is expected, which is obtained by eliminating signal leakage through a self-bias resistor.

Figure 17:
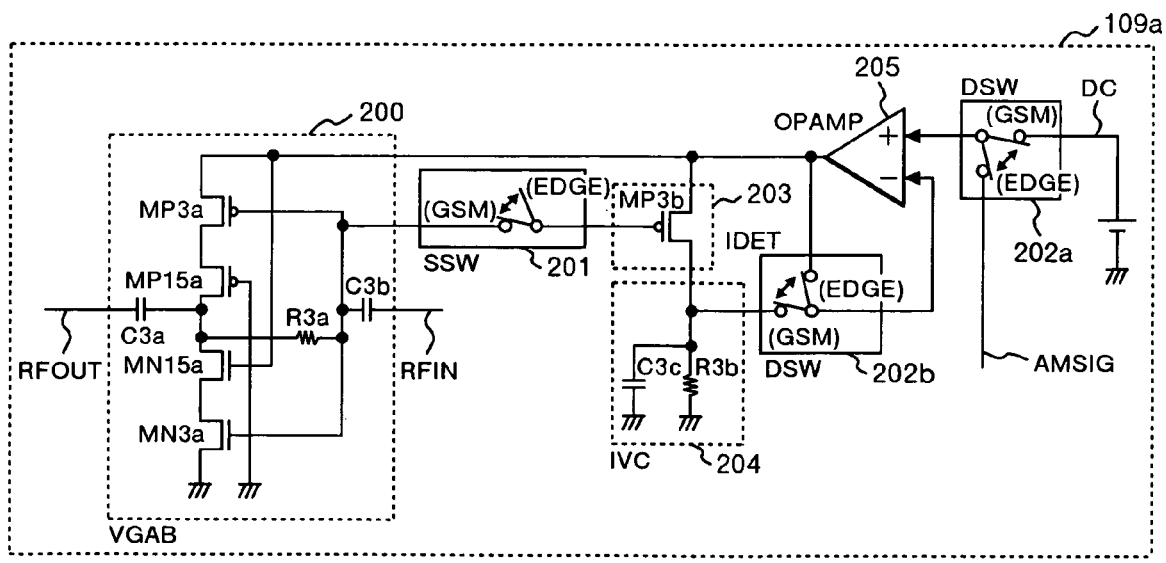
FIG. 17 is a circuit diagram for explaining a circuit example of a variable gain amplifier employed in an eighth embodiment of the present invention.

An eighth embodiment of a transmitter of the present invention will be described with FIG. 17. In the eighth embodiment, the VGA 109a shown in FIG. 3 is modified such that additional transistors are connected in series to the transistors in the VGAB 200. Other circuits are the same as in the first embodiment. The so-modified VGA 109a employed in the eighth embodiment is shown in FIG. 17. In the VGAB 200 shown in FIG. 17, the following transistors are added to the VGAB 200 shown in FIG. 3; that is, an N-type MOS transistor MN15a is attached in series to the transistor MN3a and a P-type MOS transistor MP15a is attached in series to the transistor MP3a. In comparison with the first embodiment employing shown in FIG. 3, when the VGA 200 gain is low in the case of nonconstant envelope modulation, an effect of extending the gain variable range of the VGA 109a is expected, which is obtained by reducing signal leakage through gate-drain parasitic capacitances of the transistor MP3a and the transistor MN3a.

Figure 18:
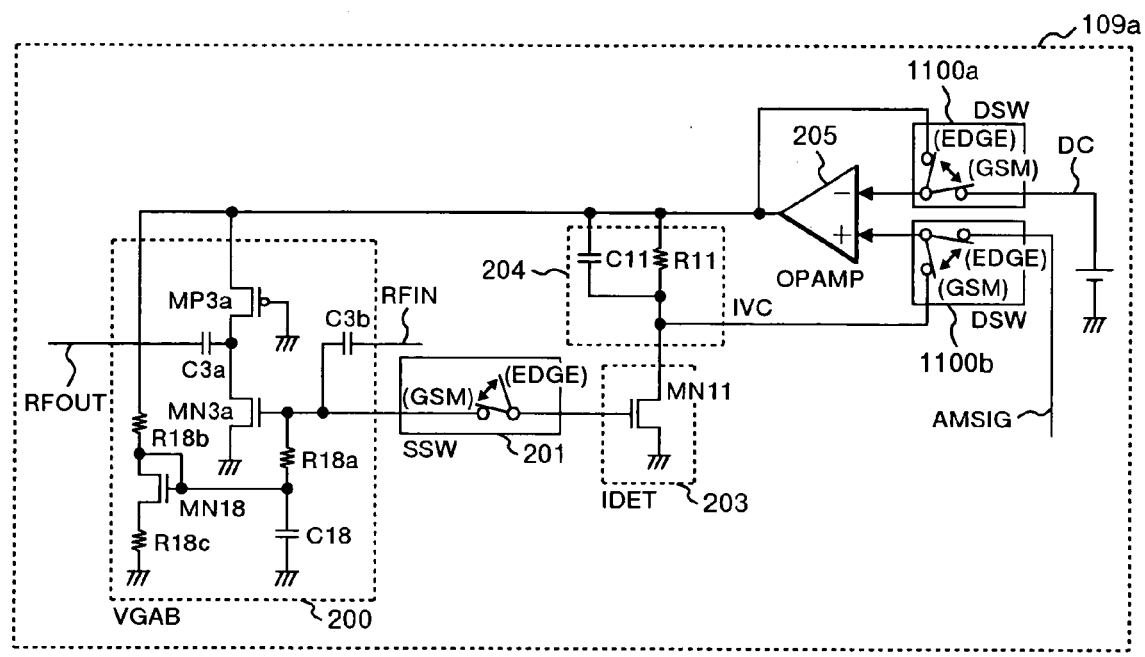
FIG. 18 is a circuit diagram for explaining a circuit example of a variable gain amplifier employed in a ninth embodiment of the present invention.

A ninth embodiment of a transmitter of the present invention will be described with FIG. 18. In the ninth embodiment, the VGA, or the VGA 109a shown in FIG. 12 is modified such that the transistor MP3a in the VGAB 200 acts as a load for the transistor MN3a and a bias circuit is added. Other circuits are the same as in the third embodiment. The so-modified VGA employed in the ninth embodiment is shown in FIG. 18. In the VGAB 200 shown in FIG. 18, a resistor R3a is removed, the gate of the transistor MP3a is grounded, and an N-type MOS transistor MN18, resistors R18a, R18b, R18c, and a capacitor C18 which constitute a bias circuit are added to the VGAB 200 shown in FIG. 12. The transistor MP3a operates in the deep triode region and acts as a load for the transistor MN3a. Gain control is performed by the potential of the source of the transistor MP3a connected to the supply voltage of the input bias circuit. In comparison with the third embodiment employing the VGA shown in FIG. 12, when the VGA 200 gain is low in the case of nonconstant envelope modulation, an effect of extending the gain variable range of the VGA 109a is expected, which is obtained by eliminating signal leakage through a self-bias resistor.

Figure 19:
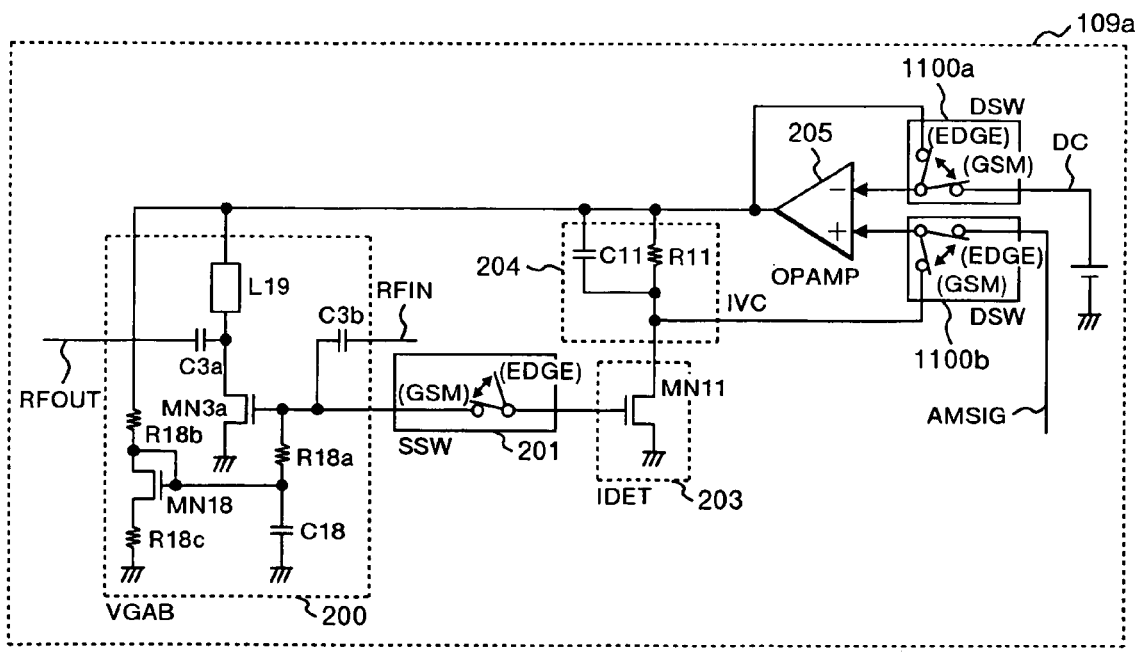
FIG. 19 is a circuit diagram for explaining another circuit example of the variable gain amplifier employed in the ninth embodiment of the present invention.

As is shown in FIG. 19, it is possible to replace the transistor MP3a with an inductor L19 in the VGAB 200. Because no voltage drop takes place in the inductor L19, it becomes possible to apply a high voltage to the transistor MN3a.

Figure 20:
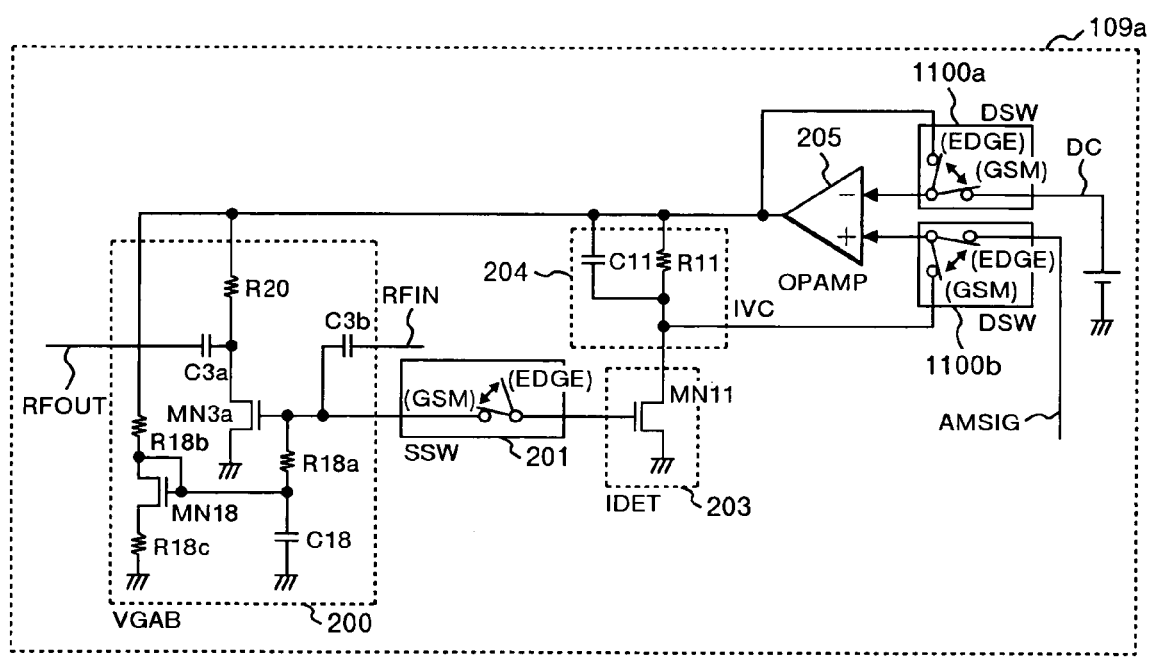
FIG. 20 is a circuit diagram for explaining yet another circuit example of the variable gain amplifier employed in the ninth embodiment of the present invention.

Moreover, as is shown in FIG. 20, it is possible to replace the inductor L19 with a resistor R20 in the VGAB 200. When circuit elements are integrated on a semiconductor substrate, generally, an area for a resistor is smaller than an area for an inductor. Thus, the size of the VGA 109b can be reduced by adopting the circuitry with the resistor R20.

Figure 21:
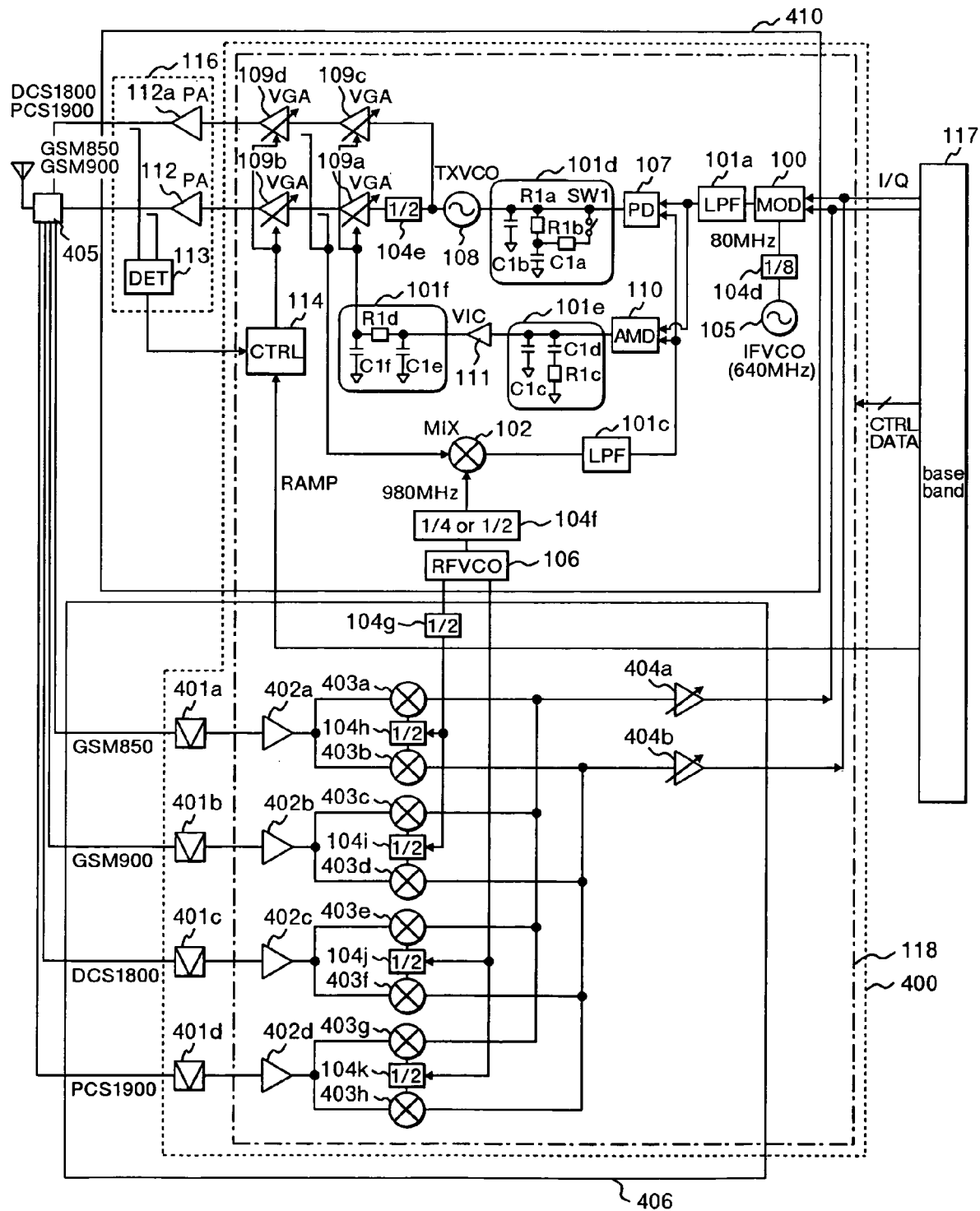
FIG. 21 is a circuit diagram for explaining a mobile communication terminal embodiment of the present invention, which is a tenth embodiment.
Figure 22:
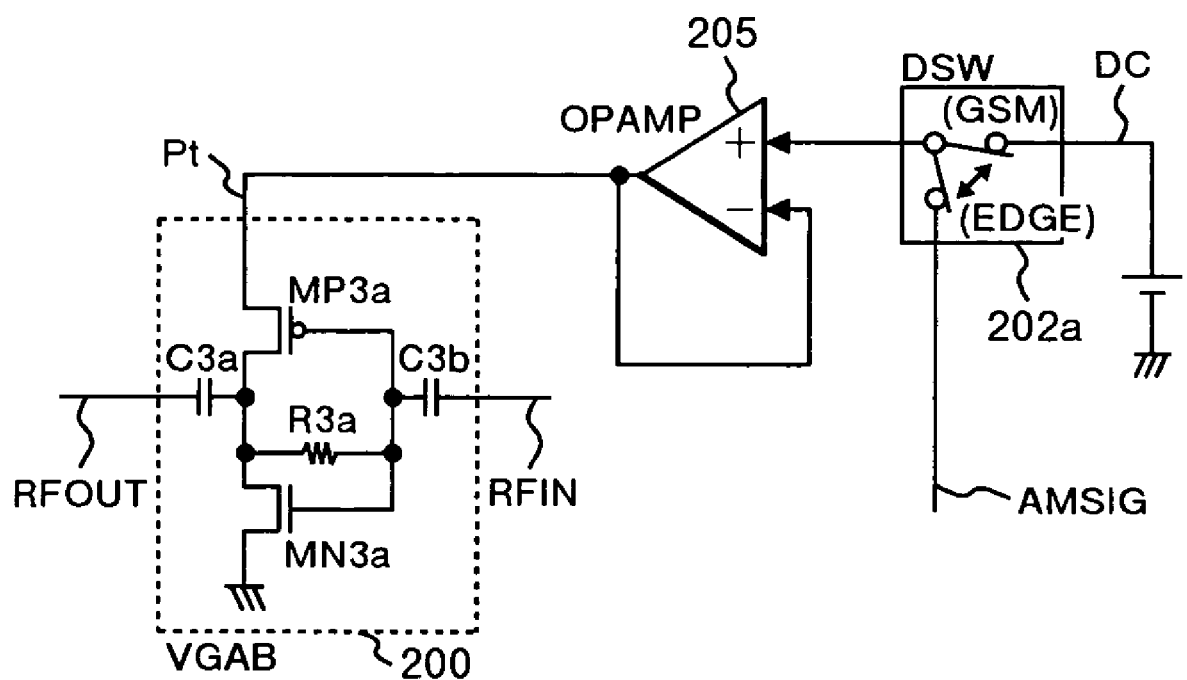
FIG. 22 is a circuit diagram for explaining an example of a variable gain amplifier considered prior to the present invention.

A mobile communication terminal embodiment of the present invention, which is a tenth embodiment, is shown in FIG. 21. The mobile communication terminal of the tenth embodiment is configured by applying the transmitter of the present invention described for the first through ninth embodiments and dual mode compatible (GSM in which GMSK modulation is performed and EDGE in which 8PSK modulation is performed). Furthermore, this terminal is capable of transmitting and receiving in four frequency bands: that is, a "GSM 850" band (transmitting frequencies of 824-849 MHz, receiving frequencies of 869-894 MHz), a "GSM 900" band (transmitting frequencies of 880-915 MHz, receiving frequencies of 925-960 MHz), a "DCS 1800" band (transmitting frequencies of 1710-1785 MHz, receiving frequencies of 1805-1880 MHz), and a "PCS 1900" band (transmitting frequencies of 1850-1910 MHz, receiving frequencies of 1930-1990 MHz). In GSM and EDGE modes, any of the above four bands is used in accordance with the intended use.

In FIG. 21, reference numeral 118 denotes a transceiver circuit consisting of a transmitting circuit and a receiving circuit which will be described later and the circuit elements are integrated in a semiconductor integrated circuit (RF-IC). The transmitting circuit is a circuitry to the same extent as the transmitting circuit 115 shown in FIG. 1. Reference numeral 400 denotes the entire transceiver circuit including SAW filters (surface acoustic wave filters) 401a to 401d which are band-pass filters and this circuit is integrated as a module. Reference numeral 116 denotes a transmit output circuit comprising PAs 112, 112a and an output signal detector 113 and this circuit is integrate as a module. Reference numeral 406 denotes a receiver comprising a receiving circuit of the transceiver circuit 118 and the SAW filters 401a to 401d.

In FIG. 21, reference numeral 117 denotes a baseband circuit which is constructed as a Large Scale Integrated (LSI) circuit. The baseband circuit 117 processes transmit data and received data appropriately and inputs I/Q baseband signals to the quadrature modulator 100 during transmitting operation and I and Q baseband signals (I/Q) from programmable gain amplifiers (hereinafter denoted as PGAs) 404 are input to it during receiving operation. The baseband circuit 117 performs intended control by supplying a control signal (CTRL DATA) to the transceiver circuit 118.

In the transmitter 410 of the mobile communication terminal of the tenth embodiment, a divide-by-2 divider 104e and VGAs 109a and 109d are added to the transmitter according to any of the first through ninth embodiments and a divider 104f that can switch between a divide-by-4 function and a divide-by-2 function is employed instead of the divide-by-4 divider 104c.

In GSM 850 and GSM 900 operations, the divide-by-2 divider 104e, VGA 109a, VGA 109b, and PA 112 operate and the VGA 109c, VGA 109d, and PA 112a are set inoperative. The divider 104f operates as a divide-by-4 divider. Other operations are the same as for the first through ninth embodiments.

In DCS 1800 and PCS 1900 operations, the VGA 109c, VGA 109d, and PA 112a operate and the divide-by-2 divider 104e, VGA 109a, VGA 109b, and PA 112 are set inoperative. The divider 104f operates as a divide-by-2 divider. The VGA 109c operates in the same way as the VGA 109 does in the GSM 850 and GSM 900 operations. The TXVCO 108 oscillates in a 1.8 GHz band in all of GSM 850, GSM 900, DCS 1800, and PCS 1900 operations.

The receiver 406, which is a direct conversion type receiver, is composed of the SAW filters 401a to 401d, low noise amplifiers (hereinafter denoted as LNAs) 402a to 402d, direct conversion mixers 403a to 403h, divide-by-2 dividers 104g to 104k, and PGAs 404a and 404b which can change their gain discretely. Instead of the PGAs 404, VGAs which can change its gain continuously can be used. In the receiver 406, the receiving circuit is configured with the circuits except the SAW filters 401a to 401d.

A received signal is input to a SAW filter that is appropriate for the operating frequency band and the output from the filter is delivered to the baseband circuit 117. For example, in GSM 850 operation, a received signal is input to the SAW filter 401a from which the signal is transferred via the LNA 402a, the direct conversion mixers 403a, 403b, and to the PGAs 404. A local signal that is input to the direct conversion mixers 403a, 403b is generated through the divide-by-2 dividers 104g and 104h.

In FIG. 21, reference numeral 405 denotes an antenna switch that connects a transmit signal line from the PA 112a or PA 112 to the antenna during transmitting operation and makes a connection between the antenna and an appropriate SAW filter 401 during receiving operation.

The transceiver circuit 118, transmit output circuit 116, and entire transceiver circuit 400 are not limited to those shown in the example of FIG. 21; for example, the control circuit 114 may be integrated into the transmit output circuit. While the direct conversion receiver is shown as an example of the receiver 406, the receiver is not limited to this type; it is needless to say that, for example, a low-IF receiver and a super-heterodyne receiver can be used.

While the foregoing first through tenth embodiments have illustrated the transmitter and mobile terminal operating in a GSM system using GMSK modulation as a constant envelope modulation system and an EDGE system using 8PSK modulation as a nonconstant envelope modulation system, it is needless to say that the present invention is not so limited and is applicable generally to communication systems in which constant envelope modulation is performed and communication systems in which nonconstant envelope modulation is performed. For example, the invention can also be applied to a wideband Code Division Multiple Access (CDMA) system in which nonconstant envelope modulation is performed.

Figure 23:
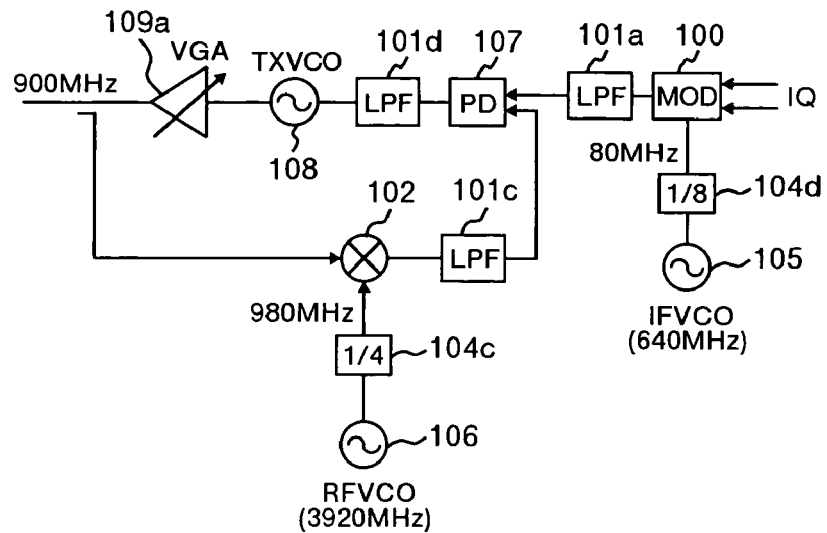
FIG. 23 is a circuit diagram for explaining an eleventh embodiment of a transmitter of the present invention.

FIG. 23 shows an eleventh embodiment of a transmitter of the present invention. The transmitter of the eleventh embodiment employs a VGA 109a as employed in any of the first through ninth embodiments of the present invention. Besides, the transmitter configuration of the eleventh embodiment includes a first carrier frequency generating circuit, a second carrier frequency generating circuits, a PM loop, a quadrature modulator (MOD) 100, and an LPF 101a. Configured in this manner, the transmitter of the eleventh embodiment can operate only in a system using constant envelope modulation, for example, the GSM system.

The first carrier frequency generating circuit is comprised of an intermediate-frequency IFVCO 105 and a divide-by-8 divider (⅛) 104d. The second carrier frequency generating circuit is comprised of an RFVCO 106 and a divide-by-4 divider (¼) 104c. The PM loop is comprised of a PD 107, LPF 101d, TXVCO 108, VGA 109a, mixer 102, and LPF 101c. The VGA 109a is provided as an output buffer of the TXVCO 108.

Now, how the transmitter configured as above operates will be described. Output from the baseband circuit, I and Q baseband signals (I/Q) which undergo constant envelope modulation used in GSM are converted into a signal with a first carrier frequency as the center frequency by the quadrature converter 100 and an unwanted signal is suppressed by the LPF 101a. An output signal of the LPF 101a becomes a reference signal that is input to the PD 107.

By the PM loop, the reference signal and a feedback signal passing via the LPF 101c to the PD 107 are controlled to have the same phase and frequency. That is, the phase control loop synchronizes with the phase of the reference signal generated from the input signal. As a result, at the output of the VGA 109a, the phase (or a frequency-modulated component) included in the reference signal is reproduced as phase information and the center frequency is converted into a desired frequency that is determined by the first and second carrier frequencies. If the output frequency of the IFVCO 105 is, for example, 640 MHz, the first carrier frequency will be 80 MHz and the center frequency of the reference signal also will be 80 MHz. Thus, the center frequency of the feedback signal to the PD 107 will be 80 MHz. On the other hand, if the frequency of the RFVCO 106 is 3920 MHz, the second carrier frequency will be 980 MHz. Because the center frequency of the output signal of the VGA 109a is frequency converted into 80 MHz by the mixer 102, eventually, the center frequency of the output signal of the VGA 109a will be 900 MHz.

Provided with the above PM loop, the transmitter of the eleventh embodiment makes an offset PLL transmitter.

Furthermore, in the eleventh embodiment, the internal switches in the VGA 109a are placed to the GSM side and the VGA 109a operates as a fixed gain amplifier. That is, the VGA 109a is used in the state that a feedback loop is formed to keep the bias current constant and variation in the output level of the offset PLL transmitter is reduced.

Needless to say, it is allowed to remove the internal switches from the VGA 109a and use the VGA 109 as a fixed gain amplifier at all times. This configuration is preferable in terms of cost reduction.

Figure 24:
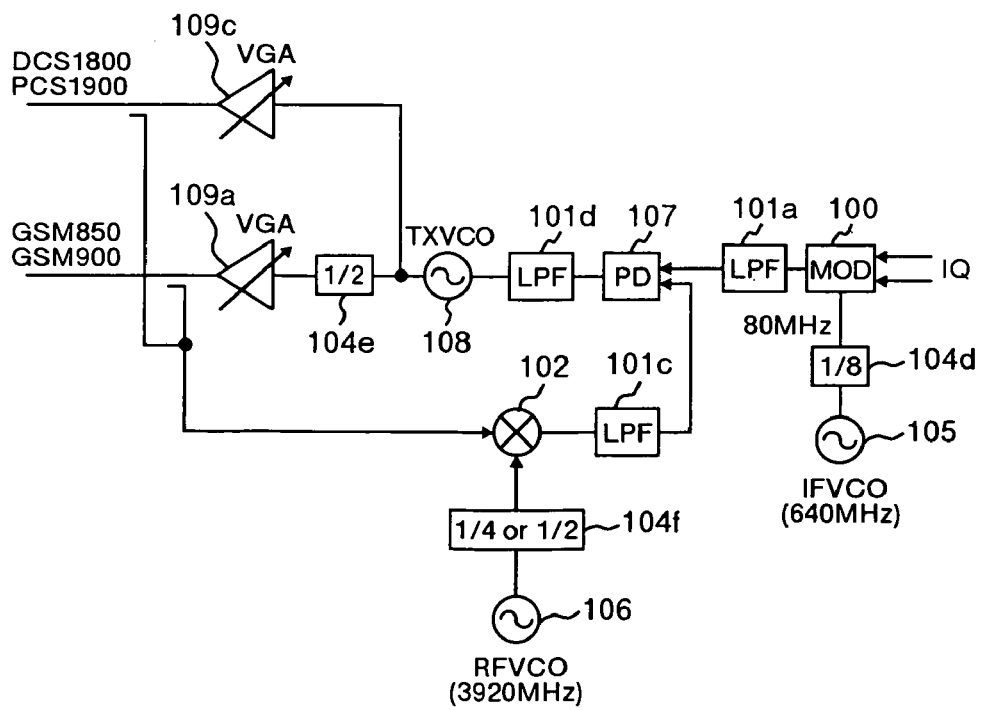
FIG. 24 is a circuit diagram for explaining a twelfth embodiment of a transmitter of the present invention.

FIG. 24 shows a twelfth embodiment of a transmitter of the present invention. In the transmitter of the twelfth embodiment, a divide-by-2 divider 104e and a VGA 109c are added to the transmitter of the eleventh embodiment and a divider 104f that can switch between a divide-by-4 function and a divide-by-2 function is employed instead of the divide-by-4 divider. Configured in this way, the transmitter of the twelfth embodiment is capable of operating in frequency bands that differ by a factor of 2. In consequence, the transmitter can operate in four frequency bands, for example, GSM 850, GSM 900, DCS 1800, and PCS 1900. The VGA 109c which is also involved in the present invention operates in the same way as the VGA 109a, except that it handles different frequency bands from those the VGA 109a handles.

When the transmitter operates in GSM 850 and GSM 900 frequency bands, the divide-by-2 divider 104e and VGA 109a operates, the VGA 109c is set inoperative, and the divider 104f operates as a divide-by-4 divider.

When the transmitter operates in DCS 1800 and PCS 1900 frequency bands, the VGA 109c operates, the divide-by-2 divider 104e and VGA 109a are set inoperative, and the divider 104f operates as a divide-by-2 divider.

In the twelfth embodiment, the VGAs 109a and 109c are used in the configuration for constant envelope modulation, that is, in the state that a feedback loop is formed to keep the bias current constant, and variation in the output level of the offset PLL transmitter adapted to transmit in four frequency bands is reduced.

According to the present invention, gain variation is reduced when the variable gain amplifier is used as a fixed gain amplifier. Therefore, an effect is expected in which the transmitter operating with both constant and nonconstant envelope modulation systems and with little variation in the transmitting power can be realized.

It is further understood by those skilled in the art that the foregoing descriptions are preferred embodiments of the disclosed device and that various changes and modifications may be made in the invention without departing from the sprit and scope thereof.

What is claimed is:

1. A transmitter comprising:
a phase control loop synchronizing with the phase of a reference signal generated from an input signal;
an amplitude control loop following the amplitude of the envelope of said reference signal;
a first variable gain amplifier which is shared by said phase control loop and said amplitude control loop and combines phase information that said phase control loop outputs and envelope information that said amplitude control loop outputs by gain control; and
a second variable gain amplifier for controlling an average power of said first variable gain amplifier, said second variable gain amplifier being disposed outside said phase control loop and said amplitude control loop,
wherein said phase control loop is shared when said reference signal is a signal modulated by constant envelope modulation and when said reference signal is a signal modulated by nonconstant envelope modulation,
said first variable gain amplifier comprising:
a first variable gain amplifier body having a supply voltage terminal and a bias current detection terminal for extracting a bias current corresponding to a gain, wherein said gain changes with a change in the potential of said supply voltage terminal; and
a bias control unit connected to said supply voltage terminal and said bias current detection terminal,
wherein a bias control loop is provided comprising said first variable gain amplifier body and said bias control unit to control said bias current so that the gain in the case of constant envelope modulation becomes a predetermined value.

2. The transmitter according to claim 1,
wherein said bias control unit comprises:
a current detector which is connected to said bias current detection terminal to detect said bias current when said reference signal is a signal modulated by constant envelope modulation;
a current-voltage converter to convert a current output by said current detector into a voltage; and
an operational amplifier which has an inverting input terminal and a noninverting input terminal and supplies its output voltage to said supply voltage terminal,
wherein, when said reference signal is a signal modulated by nonconstant envelope modulation, an envelope signal of said reference signal is input to said noninverting input terminal of said operational amplifier and the output voltage of said operational amplifier is supplied to said inverting input terminal as well as said supply voltage terminal, and
wherein, when said reference signal is a signal modulated by constant envelope modulation, a voltage output by said current-voltage converter is input to the inverting input terminal of said operational amplifier and a reference voltage is input to the noninverting input terminal.

3. The transmitter according to claim 1,
wherein said bias control unit comprises:
a current detector which is connected to said bias current detection terminal to detect said bias current when said reference signal is a signal modulated by constant envelope modulation;
a current-voltage converter to convert a current output by said current detector into a voltage; and
an operational amplifier which has an inverting input terminal and a noninverting input terminal and supplies its output voltage to said supply voltage terminal,
wherein, when said reference signal is a signal modulated by nonconstant envelope modulation, the output voltage of said operational amplifier is supplied to said inverting input terminal as well as said supply voltage terminal and an envelope signal of said reference signal is input to said noninverting input terminal of said operational amplifier, and
wherein, when said reference signal is a signal modulated by constant envelope modulation, a voltage output by said current-voltage converter is input to said noninverting input terminal of said operational amplifier and a reference voltage is input to said inverting input terminal.

4. The transmitter according to claim 1,
wherein said bias control unit comprises:
a current detector which is connected to said bias current detection terminal to detect said bias current when said reference signal is a signal modulated by constant envelope modulation;
a current-voltage converter to convert a current output by said current detector into a voltage;
an operational amplifier which has an inverting input terminal and a noninverting input terminal and supplies its output voltage to said supply voltage terminal; and
a first resistor and a second resistor connected in series between an output terminal of said operational amplifier and ground,
wherein, when said reference signal is a signal modulated by nonconstant envelope modulation, an envelope signal of said reference signal is input to said noninverting input terminal of said operational amplifier and a connection point between said first resistor and said second resistor is connected to said inverting input terminal, and wherein, when said reference signal is a signal modulated by constant envelope modulation, a voltage output by said current-voltage converter is input to said inverting input terminal of said operational amplifier and a reference voltage is input to said noninverting input terminal.

5. The transmitter according to claim 1,
wherein said bias control unit comprises:
a current detector which is connected to said bias current detection terminal to detect said bias current when said reference signal is a signal modulated by constant envelope modulation;
a current-voltage converter to convert a current output by said current detector into a voltage;
an operational amplifier which has an inverting input terminal and a noninverting input terminal and supplies its output voltage to said supply voltage terminal; and
a first resistor and a second resistor connected in series between an output terminal of said operational amplifier and ground,
wherein, when said reference signal is a signal modulated by nonconstant envelope modulation, a connection point between said first resistor and said second resistor is connected to said inverting input terminal of said operational amplifier and an envelope signal of said reference signal is input to said noninverting input terminal of said operational amplifier, and
wherein, when said reference signal is a signal modulated by constant envelope modulation, a voltage output by said current-voltage converter is input to said noninverting input terminal of said operational amplifier and a reference voltage is input to said inverting input terminal.

6. The transmitter according to claim 1,
wherein said first variable gain amplifier body comprises:
a P-type MOS transistor with its source terminal connected to said supply voltage terminal; and
an N-type MOS transistor with its source terminal grounded,
wherein, for said P-type MOS transistor and said N-type MOS transistor, their gate terminals are connected together and their drain terminals are connected together,
wherein the connected gate terminals are connected to said bias current detection terminal and coupled via a first capacitor to an input terminal,
wherein the connected drain terminals are coupled via a second capacitor to an output terminal, and
wherein a resistor is connected between said connected gate terminals and said connected drain terminals.

7. The transmitter according to claim 1,
wherein said first variable gain amplifier body is configured as a differential type amplifier.

8. The transmitter according to claim 2,
wherein said current detector comprises a P-type MOS transistor whose source terminal is connected to said supply voltage terminal, whose gate terminal is an input terminal, and whose drain terminal is an output terminal, and
wherein said current-voltage converter comprises a first resistor and a capacitor which are connected in parallel, one terminal of the parallel connection being grounded and the other terminal being connected to said drain terminal, and said current-voltage converter shares said output terminal with said current detector.

9. The transmitter according to claim 8,
wherein said current-voltage converter further comprises a second resistor, and
wherein said second resistor is connected in series to said capacitor.

10. The transmitter according to claim 2,
wherein said current detector comprises a P-type MOS transistor whose source terminal is connected to said supply voltage terminal, whose gate terminal is coupled via a first resistor to an input terminal and grounded via a capacitor, and whose drain terminal is an output terminal, and
wherein said current-voltage converter comprises a second resistor connected between said drain terminal and ground and shares said output terminal with said current detector.

11. The transmitter according to claim 2,
wherein said current detector comprises an N-type MOS transistor whose source terminal is grounded and whose gate terminal is an input terminal, a first P-type MOS transistor whose source terminal is connected to said supply voltage terminal and whose drain terminal is connected to its gate terminal and connected to a drain terminal of said N-type MOS transistor, and a second P-type MOS transistor whose source terminal is connected to said supply voltage terminal, whose drain terminal is an output terminal, and whose gate terminal is connected to the gate terminal of said first P-type MOS transistor, and
wherein said current-voltage converter comprises a first resistor and a capacitor which are connected in parallel, one terminal of the parallel connection being grounded and the other terminal being connected to the drain terminal of said second P-type MOS transistor, and said current-voltage converter shares said output terminal with said current detector.

12. The transmitter according to claim 11,
wherein said current-voltage converter further comprises a second resistor, and
wherein said second resistor is connected in series to said capacitor.

13. The transmitter according to claim 3,
wherein said current detector comprises an N-type MOS transistor whose source terminal is grounded, whose gate terminal is an input terminal, and whose drain terminal is an output terminal, and
wherein said current-voltage converter comprises a resistor and a first capacitor which are connected in parallel, one terminal of the parallel connection being connected to said supply voltage terminal and the other terminal being connected to said drain terminal, and said current-voltage converter shares said output terminal with said current detector.

14. The transmitter according to claim 13,
wherein said current-voltage converter further comprises a second resistor, and
wherein said second resistor is connected in series to said capacitor.

15. A mobile communication terminal comprising:
a baseband circuit which performs baseband signal processing;
a transmitter to which transmit baseband signals output from said baseband circuit are input and which generates a reference signal from said transmit baseband signals;
a receiver which outputs received baseband signals to said baseband circuit;

a switch which switches a connection to the output of said transmitter or a connection to the input of said receiver; and an antenna connected to said switch, said transmitter comprising:

a phase control loop synchronizing with the phase of said reference signal;

an amplitude control loop following the amplitude of the envelope of said reference signal;

a first variable gain amplifier which is shared by said phase control loop and said amplitude control loop and combines phase information that said phase control loop outputs and envelope information that said amplitude control loop outputs by gain control; and a second variable gain amplifier for controlling an average power of said first variable gain amplifier, said second variable gain amplifier being disposed outside said phase control loop and said amplitude control loop, wherein said phase control loop is shared when said reference signal is a signal modulated by constant envelope modulation and when said reference signal is a signal modulated by nonconstant envelope modulation, said first variable gain amplifier comprising:

a first variable gain amplifier body having a supply voltage terminal and a bias current detection terminal for extracting a bias current corresponding to a gain, wherein said gain changes with a change in the potential of said supply voltage terminal; and a bias control unit connected to said supply voltage terminal and said bias current detection terminal, wherein a bias control loop is provided comprising said first variable gain amplifier body and said bias control unit to control said bias current so that the gain in the case of constant envelope modulation becomes a predetermined value.

16. The mobile communication terminal according to claim 15, wherein said bias control unit comprises:

a current detector which is connected to said bias current detection terminal to detect said bias current when said reference signal is a signal modulated by constant envelope modulation;

a current-voltage converter to convert a current output by said current detector into a voltage; and an operational amplifier which has an inverting input terminal and a noninverting input terminal and supplies its output voltage to said supply voltage terminal, wherein, when said reference signal is a signal modulated by nonconstant envelope modulation, an envelope signal of said reference signal is input to said noninverting input terminal of said operational amplifier and the output voltage of said operational amplifier is supplied to said inverting input terminal as well as said supply voltage terminal, and wherein, when said reference signal is a signal modulated by constant envelope modulation, a voltage output by said current-voltage converter is input to the inverting input terminal of said operational amplifier and a reference voltage is input to the noninverting input terminal.

17. The mobile communication terminal according to claim 15, wherein said bias control unit comprises:

a current detector which is connected to said bias current detection terminal to detect said bias current when said reference signal is a signal modulated by constant envelope modulation;

a current-voltage converter to convert a current output by said current detector into a voltage; and an operational amplifier which has an inverting input terminal and a noninverting input terminal and supplies its output voltage to said supply voltage terminal, wherein, when said reference signal is a signal modulated by nonconstant envelope modulation, the output voltage of said operational amplifier is supplied to said inverting input terminal as well as said supply voltage terminal and an envelope signal of said reference signal is input to said noninverting input terminal of said operational amplifier, and wherein, when said reference signal is a signal modulated by constant envelope modulation, a voltage output by said current-voltage converter is input to said noninverting input terminal of said operational amplifier and a reference voltage is input to said inverting input terminal.

18. The mobile communication terminal according to claim 15, wherein said first variable gain amplifier body comprises:

a P-type MOS transistor with its source terminal connected to said supply voltage terminal; and an N-type MOS transistor with its source terminal grounded, wherein, for said P-type MOS transistor and said N-type MOS transistor, their gate terminals are connected together and their drain terminals are connected together, wherein the connected gate terminals are connected to said bias current detection terminal and coupled via a first capacitor to an input terminal, wherein the connected drain terminals are coupled via a second capacitor to an output terminal, and wherein a resistor is connected between said connected gate terminals and said connected drain terminals.

19. The mobile communication terminal according to claim 16, wherein said current detector comprises a P-type MOS transistor whose source terminal is connected to said supply voltage terminal, whose gate terminal is an input terminal, and whose drain terminal is an output terminal, and wherein said current-voltage converter comprises a resistor and a capacitor which are connected in parallel, one terminal of the parallel connection being grounded and the other terminal being connected to said drain terminal, and said current-voltage converter shares said output terminal with said current detector.

20. The mobile communication terminal according to claim 17, wherein said current detector comprises an N-type MOS transistor whose source terminal is grounded, whose gate terminal is an input terminal, and whose drain terminal is an output terminal, and wherein said current-voltage converter comprises a resistor and a capacitor which are connected in parallel, one terminal of the parallel connection being connected to said supply voltage terminal and the other terminal being connected to said drain terminal, and said current-voltage converter shares said output terminal with said current detector.

21. A transmitter comprising:

a phase control loop synchronizing with the phase of a reference signal generated from an input signal, said phase control loop comprising a first variable gain amplifier for output power control, said transmitter comprising a second variable gain amplifier for controlling an average power of said first variable gain amplifier, said second variable gain amplifier being disposed outside said phase control loop, said first variable gain amplifier comprising:

a first variable gain amplifier body having a supply voltage terminal and a bias current detection terminal for extracting a bias current corresponding to a gain, wherein said gain changes with a change in the potential of said supply voltage terminal; and a bias control unit connected to said supply voltage terminal and said bias current detection terminal, wherein a bias control loop is provided comprising said first variable gain amplifier body and said bias control unit to control said bias current so that the gain becomes a predetermined value.

22. The transmitter according to claim 21, wherein said bias control unit comprises:

a current detector which is connected to said bias current detection terminal to detect said bias current;

a current-voltage converter to convert a current output by said current detector into a voltage; and an operational amplifier which has an inverting input terminal and a noninverting input terminal and supplies its output voltage to said supply voltage terminal, wherein a voltage output by said current-voltage converter is input to the inverting input terminal of said operational amplifier and a reference voltage is input to the noninverting input terminal.

23. The transmitter according to claim 21, wherein said first variable gain amplifier body comprises:

a P-type MOS transistor with its source terminal connected to said supply voltage terminal; and an N-type MOS transistor with its source terminal grounded, wherein, for said P-type MOS transistor and said N-type MOS transistor, their gate terminals are connected together and their drain terminals are connected together, wherein the connected gate terminals are connected to said bias current detection terminal and coupled via a first capacitor to an input terminal, wherein the connected drain terminals are coupled via a second capacitor to an output terminal, and wherein a resistor is connected between said connected gate terminals and said connected drain terminals.

* * * * *